United States Patent
Shikina

(10) Patent No.: US 10,356,354 B2
(45) Date of Patent: Jul. 16, 2019

(54) IMAGING APPARATUS, IMAGING SYSTEM, AND MOVING OBJECT

(71) Applicant: CANON KABUSHIKI KAISHA, Tokyo (JP)

(72) Inventor: Noriyuki Shikina, Hachioji (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/882,768

(22) Filed: Jan. 29, 2018

(65) Prior Publication Data

US 2018/0220096 A1 Aug. 2, 2018

(30) Foreign Application Priority Data

Jan. 30, 2017 (JP) .................................. 2017-014846

(51) Int. Cl.
| | |
|---|---|
| H04N 5/378 | (2011.01) |
| H01L 27/146 | (2006.01) |
| H04N 5/374 | (2011.01) |
| G09G 3/00 | (2006.01) |
| H04N 5/376 | (2011.01) |
| H04N 17/00 | (2006.01) |

(52) U.S. Cl.
CPC ............ *H04N 5/378* (2013.01); *G09G 3/006* (2013.01); *H01L 27/14612* (2013.01); *H01L 27/14636* (2013.01); *H01L 27/14643* (2013.01); *H04N 5/376* (2013.01); *H04N 5/3741* (2013.01); *H04N 17/002* (2013.01)

(58) Field of Classification Search
None
See application file for complete search history.

(56) References Cited

U.S. PATENT DOCUMENTS

| | | | | |
|---|---|---|---|---|
| 5,818,526 | A | * 10/1998 | Nomoto | ............... H04N 3/1512 348/302 |
| 2013/0027563 | A1 | 1/2013 | Mellot | |
| 2013/0075584 | A1 | * 3/2013 | Yaghmai | ................ H04N 5/272 250/208.1 |
| 2013/0093910 | A1 | * 4/2013 | Lee | ........................ H04N 5/376 348/222.1 |

FOREIGN PATENT DOCUMENTS

JP 2016-103780 A 6/2016

* cited by examiner

*Primary Examiner* — James M Hannett
(74) *Attorney, Agent, or Firm* — Canon U.S.A., Inc. IP Division

(57) ABSTRACT

An embodiment provides an imaging apparatus including pixels arranged to form rows including first and second rows, first control lines connected to the pixels of the first row, second control lines connected to the pixels of the second row, and a scan unit including at least a first row drive unit generating first control signals supplied to the first control lines and a second row drive unit generating second control signals supplied to the second control lines, the scan unit being configured to drive the pixels in units of rows based on a scanning signal. The first control signals generated by the first row drive unit is input to the second row drive unit. The second row drive unit selects the first control signals and the scanning signal and generates the second control signals based on the selected signals.

20 Claims, 17 Drawing Sheets

IMAGING APPARATUS, IMAGING SYSTEM, AND MOVING OBJECT

BACKGROUND OF THE INVENTION

Field of the Invention

The present invention relates to an imaging apparatus, an imaging system, and a moving object.

Description of the Related Art

There are known imaging apparatuses including a plurality of pixels, such as a digital camera, a projector, and a display. Japanese Patent Application Laid-Open No. 2016-103780 discusses an imaging apparatus including a complementary metal-oxide semiconductor (CMOS) image sensor that is an XY address type imaging element. Each functional block in the imaging apparatus is tested before shipment. Japanese Patent Application Laid-Open No. 2016-103780 discusses a vertical scan unit as one of functional blocks to be tested.

The vertical scan unit discussed in Japanese Patent Application Laid-Open No. 2016-103780 includes (n+1) sets of holding units, set/reset units, and signal generation units in accordance with a plurality of rows from the zeroth row to the nth row. The set/reset unit in the Lth row (L is an integer from 1 to n) resets the holding unit in the Lth row in response to reset of an output signal of the signal generation unit in the (L−1)th row. By repeating this operation, reset operations are sequentially performed in the plurality of rows. A circuit included in a transmission path can be inspected by confirming that the reset operation in the last row has been performed.

SUMMARY OF THE INVENTION

According to an aspect of the present invention, an imaging apparatus includes a plurality of pixels arranged to form a plurality of rows including a first row and a second row, a plurality of first control lines connected to the pixels of the first row, a plurality of second control lines connected to the pixels of the second row, and a scan unit including at least a first row drive unit configured to generate a plurality of first control signals supplied to the plurality of first control lines and a second row drive unit configured to generate a plurality of second control signals supplied to the plurality of second control lines, the scan unit being configured to drive the plurality of pixels in units of rows based on a scanning signal, wherein the plurality of first control signals generated by the first row drive unit is input to the second row drive unit, and wherein the second row drive unit selects the plurality of first control signals and the scanning signal and generates the plurality of second control signals based on the selected signals.

According to another aspect of the present invention, an imaging apparatus includes a plurality of pixels arranged to form a plurality of rows including a first row and a second row, a first control line connected to the pixels of the first row, a second control line connected to the pixels of the second row, and a scan unit including at least a first row drive unit configured to generate a first control signal supplied to the first control line and a second row drive unit configured to generate a second control signal supplied to the second control line, the scan unit being configured to drive the plurality of pixels in units of rows based on a scanning signal, wherein each of the first row drive unit and the second row drive unit includes a first holding unit and a second holding unit connected to an output node of the first holding unit, wherein the first control signal generated by the first row drive unit and output from the second holding unit of the first row drive unit is input to the first holding unit of the second row drive unit, and wherein the second row drive unit selects the first control signal and the scanning signal and outputs the second control signal based on the selected signals.

Further features of the present invention will become apparent from the following description of exemplary embodiments with reference to the attached drawings.

DESCRIPTION OF THE EMBODIMENTS

The present inventors have newly found that it is preferable to improve a test coverage rate in a test of an imaging apparatus. However, in the imaging apparatus discussed in Japanese Patent Application Laid-Open No. 2016-103780, only one signal generation unit can be inspected among a plurality of signal generation units included in each row of the vertical scan unit. Alternatively, in a case where a holding unit in each row of the vertical scan unit includes a plurality of storage elements, it is difficult to inspect all the storage elements. Consequently, there arises a problem that the test coverage rate decreases. In several exemplary embodiments, the test coverage rate can be improved.

[Overall Block Diagram]

Figure 1:
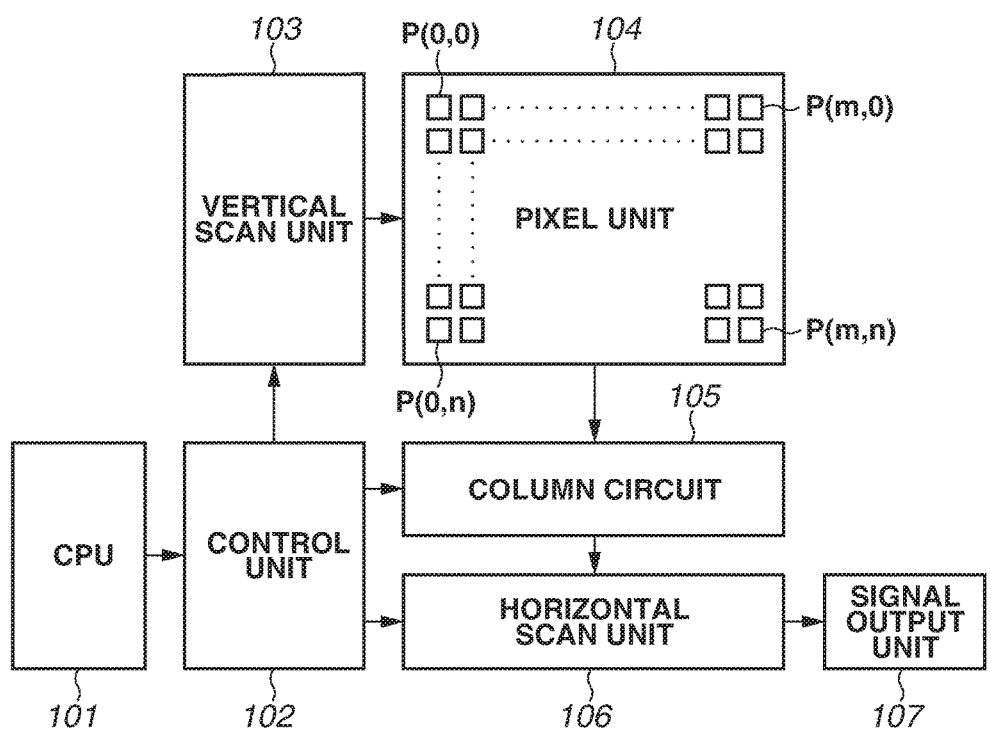
FIG. 1 is a block diagram schematically illustrating a configuration example of an imaging apparatus according to a first exemplary embodiment.

FIG. 1 is a block diagram schematically illustrating a configuration example of an imaging apparatus according to a first exemplary embodiment. The imaging apparatus includes a central processing unit (CPU) 101, a control unit 102, a vertical scan unit 103, a pixel unit 104, a column circuit 105, a horizontal scan unit 106, and a signal output unit 107. The CPU 101 controls the entire apparatus. The control unit 102 receives a synchronization signal from the CPU 101 and controls each unit of the imaging apparatus. The vertical scan unit 103 receives control signals from the control unit 102 to operate. The pixel unit 104 includes a plurality of pixels arranged to form a plurality of rows. The column circuit 105 processes signals from the pixel unit 104. The horizontal scan unit 106 sequentially reads out the signals from the column circuit 105 to the signal output unit 107. The column circuit 105 and the horizontal scan unit 106 receive the control signal of the control unit 102 to operate. In FIG. 1, each pixel is denoted by a sign P(x, y). In each sign, x and y indicate a column number and a row number of the pixel, respectively.

[Column Configuration]

Figure 2A:
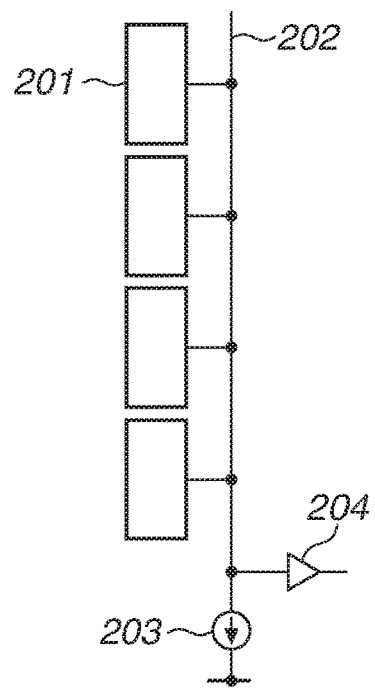
FIG. 2A is a diagram schematically illustrating a configuration of a pixel unit according to the first exemplary embodiment.
Figure 2B:
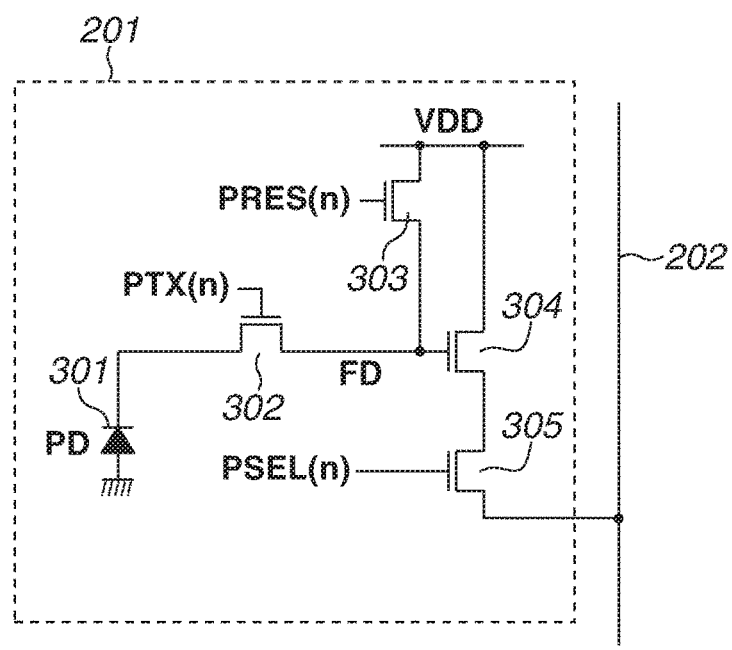
FIG. 2B is a schematic diagram illustrating an equivalent circuit of a pixel of the imaging apparatus according to the first exemplary embodiment.

FIGS. 2A and 2B are schematic diagrams illustrating a configuration example of the pixel unit 104 and the column circuit 105 according to the present exemplary embodiment. A plurality of pixels 201 forming one column is connected to one vertical output line 202. In the present exemplary embodiment, the plurality of pixels 201 is arranged to form a matrix including a plurality of columns and a plurality of rows. Accordingly, a plurality of vertical output lines 202 is arranged. Further, the vertical output line 202 is connected to a constant current source 203. The vertical output line 202 is also connected to a column amplifier 204. The constant current source 203 and the column amplifier 204 are included in the column circuit 105.

[Pixel Circuit]

FIG. 2B is a diagram illustrating an equivalent circuit of the pixel 201 according to the present exemplary embodiment. Although the pixel 201 arranged in the nth row will be described as an example, all the pixels have the same circuit configuration in the present exemplary embodiment. The pixel 201 includes a photoelectric conversion element 301, a charge transfer unit 302, a floating diffusion portion (hereinafter referred to as FD), a reset unit 303, a signal amplification unit 304, and a row selection unit 305. The photoelectric conversion element 301 has an element such as a photodiode that generates electric charges corresponding to an incident light quantity in photoelectric conversion.

The charge transfer unit 302 is connected between the photoelectric conversion element 301 and the FD. The charge transfer unit 302 is, for example, a transfer transistor that transfers the electric charges accumulated in the photoelectric conversion element 301 to the FD. Conduction/non-conduction (on/off) of the charge transfer unit 302 is controlled by a pixel transfer signal PTX(n).

The reset unit 303 is connected between power supply voltage VDD and the FD. The reset unit 303 is, for example, a reset transistor that supplies the power supply voltage VDD to the FD and resets voltage of the FD. Conduction/non-conduction (on/off) of the reset unit 303 is controlled by a pixel unit reset signal PRES(n).

The FD is connected to a gate terminal of the signal amplification unit 304. The power supply voltage VDD and the row selection unit 305 are connected to a drain terminal and a source terminal of the signal amplification unit 304, respectively. The signal amplification unit 304 is, for example, an amplification transistor that converts the electric charges accumulated in the FD into voltage, amplifies the voltage, and outputs the voltage as a voltage signal to the vertical output line 202. In the present exemplary embodiment, the amplification transistor and the constant current source 203 constitute a source follower circuit.

The row selection unit 305 is connected between the source terminal of the signal amplification unit 304 and the vertical output line 202. The row selection unit 305 is, for example, a selection transistor that selects a row that outputs a pixel signal. Conduction/non-conduction (on/off) of the row selection unit 305 is controlled by a row selection signal PSEL(n).

The pixel transfer signal PTX(n), the pixel unit reset signal PRES(n), and the row selection signal PSEL(n) are the control signals that control driving of the pixel 201. In the present exemplary embodiment, a plurality of control signals is supplied to one pixel 201. In the signs for the control signals, (n) means that the control signals are supplied to the pixel 201 in the nth row.

[Scan Circuit]

Figure 3:
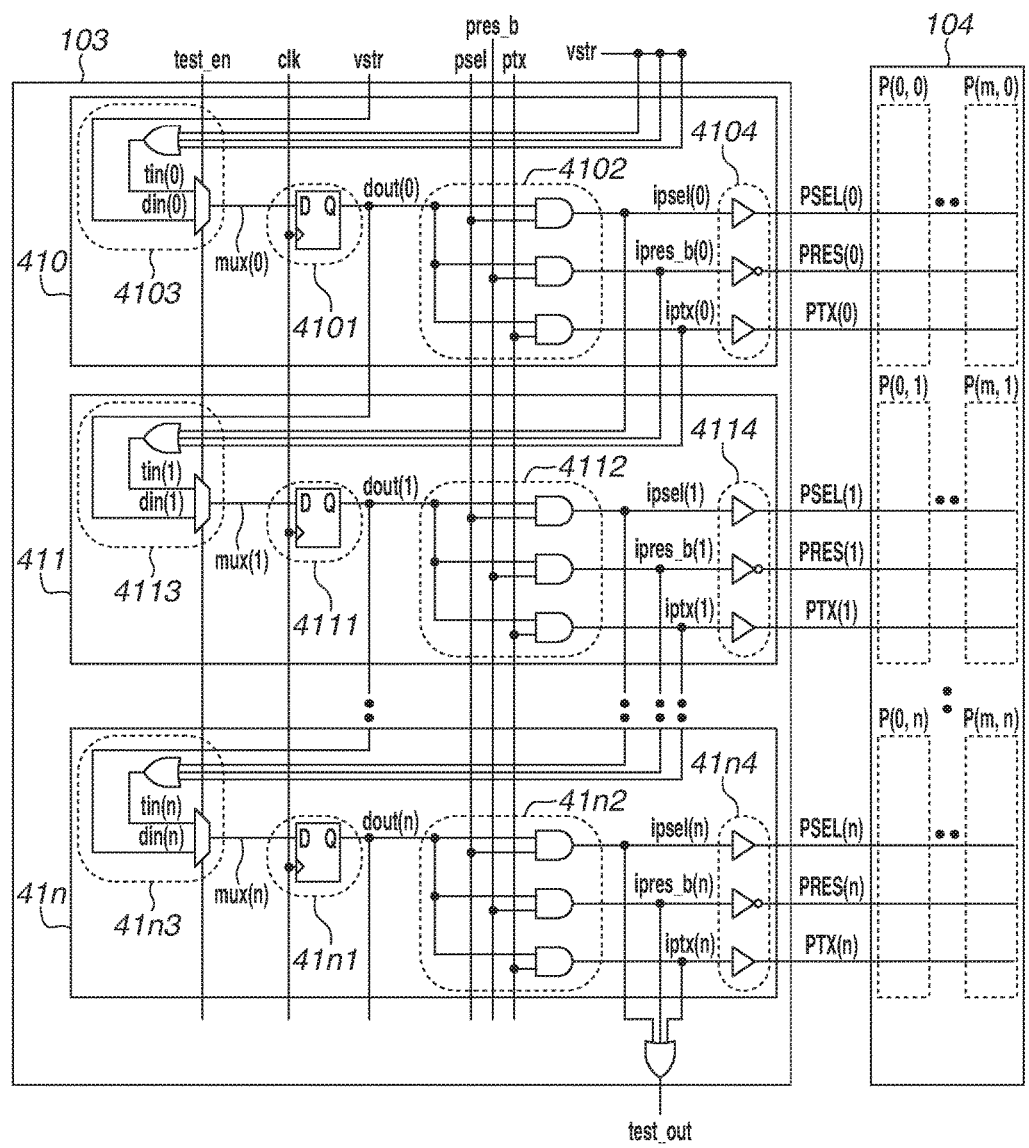
FIG. 3 is a block diagram schematically illustrating a configuration example of a vertical scan unit according to the first exemplary embodiment.

FIG. 3 is a block diagram illustrating a configuration example of the vertical scan unit 103 according to the present exemplary embodiment. The vertical scan unit 103 includes row drive units 410 to 41$n$. The vertical scan unit 103 of the present exemplary embodiment is in a form of a shift register.

A configuration of the row drive unit 411 in the first row will be described as an example. The same applies to the row drive units in other rows. The row drive unit 411 includes a holding unit 4111, a signal generation unit 4112, a scanning signal selection unit 4113, and a level shift unit 4114. The row drive unit 411 supplies the control signals to a plurality of control lines connected to the pixels in corresponding one row.

The holding unit 4111 includes a flip-flop circuit. The holding unit 4111 stores a level of an output signal mux(1) of the scanning signal selection unit 4113 at timing when a clock signal clk generated by the control unit 102 becomes a High level.

The signal generation unit 4112 performs a logical operation of an output signal dout(1) of the holding unit 4111 and a pulse psel supplied from the control unit 102 to generate a control signal ipsel(1). Further, the signal generation unit 4112 performs a logical operation of the output signal dout(1) and a pulse pres_b supplied from the control unit 102 to generate a control signal ipres_b(1). Further, the signal generation unit 4112 performs a logical operation of the output signal dout(1) and a pulse ptx supplied from the control unit 102 to generate a control signal iptx(1).

The level shift unit 4114 is a buffer circuit that shifts a level of an input signal. The level shift unit 4114 inverts the input signal as necessary. The control signal ipsel(1) is output as a row selection signal PSEL(1) by the level shift unit 4114 to the control line connected to the pixel. Similarly, the control signal ipres_b(1) and the control signal iptx(1) are respectively output as a pixel unit reset signal PRES(1) and a pixel transfer signal PTX(1) to the control lines connected to the pixel. An output node of the buffer circuit is connected to the control line of the pixel. Meanwhile, an input node of the buffer circuit is connected to the adjacent row drive unit 412.

An output signal dout(0) of a holding unit 4101 of the row drive unit 410 in the zeroth row is input to the row drive unit 411 in the first row. For convenience, the output signal dout(0) input to the row drive unit 411 in the first row is referred to as an input signal din(1). The output signal dout(0) and the input signal din(1) are the same signal. Further, a control signal ipsel(0), a control signal ipres_b(0), and a control signal iptx(0) generated by a signal generation unit 4102 in the zeroth row are input to the row drive unit 411 in the first row. An input signal tin(1) is generated by calculating the logical sum (OR) of these control signals.

The scanning signal selection unit 4113 selects one of the input signal din(1) and the input signal tin(1), and outputs the selected one as the output signal mux(1) to the holding unit 4111 in the following stage. In a case where a signal test_en generated by the control unit 102 is in a Low level, the input signal din(1) is output as the output signal mux(1). Since the input signal din(1) is the output signal dout(0) of the holding unit 4101 in the zeroth row, in the case where the signal test_en is in a Low level, the vertical scan unit 103 operates as the shift register. In other words, the output signal dout(0) and the input signal din(1) are the scanning signals given to the vertical scan unit 103.

Further, in a case where the signal test_en is in a High level, the input signal tin(1) is output as the output signal mux(1). Here, the input signal tin(1) is based on the control signals generated by the signal generation unit 4102 in the zeroth row. In other words, the input signal tin(1) is an inspection signal indicating whether the row drive unit 410 in the zeroth row in the preceding stage is operating normally.

The scanning signal selection unit 4113 illustrated in FIG. 3 is an example, and a circuit configuration of the scanning signal selection unit 4113 can be changed. For example, instead of calculating the logical sum (OR) of the control signals, the logical operation such as the exclusive logical sum (EXOR) may be used. Alternatively, instead of performing the logical operation, a multiplexer may be used.

[Drive Method 1-1: Readout Operation of Photoelectric Conversion Element]

Figure 4:
FIG. 4 is a timing chart illustrating an example of a readout operation of a photoelectric conversion element according to the first exemplary embodiment.

Hereinafter, a method of driving the imaging apparatus according to the present exemplary embodiment will be described. First, driving for reading out signals based on the electric charges generated in the photoelectric conversion element 301 will be described. FIG. 4 is a timing chart illustrating an example of the operations of the vertical scan unit 103 and the pixel unit 104 illustrated in FIG. 3.

First, the signal test_en is Low during the entire period. Accordingly, an input signal din(k) (=an output signal dout (k−1)) is selected under control of a scanning signal selection unit 41k3 in each row and is output as an output signal mux(k) (k is an arbitrary integer that satisfies the following formula: 1≤k≤n). Vertical scanning start signals vstr are input to a scanning signal selection unit 4103 in the zeroth row.

At time T00, a readout operation of the photoelectric conversion element 301 is started. The CPU 101 inputs a vertical synchronization signal VD and a horizontal synchronization signal HD to the control unit 102. At the same time, the vertical scanning start signals vstr are input.

Next, at time T00a, the clock signal clk transitions to High, and the holding unit 4101 stores High of the vertical scanning start signals vstr. With this operation, the output signal dout(0) transitions to High and is held until time T01a. Also during the same period, output signals dout(k) in other rows are held Low. Accordingly, only the signal generation unit 4102 that receives the output signal dout(0) can generate the control signals.

A pixel drive pulse in a similar time zone, i.e., from the time T00a to the time T01a will be described. Only the control signal ipsel(0) in the zeroth row among a plurality of control signals ipsel(k) transitions according to a waveform of the pulse psel. Accordingly, in pixels P(0, 0) to (m, 0), the row selection units 305 become conductive and the pixels P(0, 0) to (m, 0) are connected to the vertical output line 202. Further, pixels in other rows are not connected to the vertical output line 202.

Similarly, only the control signal ipres_b(0) among a plurality of control signals ipres_b(k) transitions according to a waveform of the pulse pres_b. A pixel unit reset signal PRES(k) has an inverted waveform of the control signal ipres_b(k). Thus, in the pixels P(0, 0) to (m, 0), resetting of the FD is canceled while the control signal ipres_b(0) is High. In other words, the FD is in a floating state. Further, in the pixels in the other rows, the FD is held in a reset state.

Similarly, only the control signal iptx(0) among a plurality of control signals iptx(k) transitions according to a waveform of the pulse ptx. Accordingly, the signals based on the electric charges of the photoelectric conversion element 301 of the pixels P(0, 0) to (m, 0) can be read out via the vertical output line 202.

Next, at the time T01a, the clock signal clk transitions to High, and the holding unit 4101 stores Low of the vertical scanning start signals vstr. At the same time, the output signal dout(0) at a High level is input to the scanning signal selection unit 4113 as the input signal din(1). Further, the scanning signal selection unit 4113 selects the input signal din(1). Thus, the holding unit 4111 stores High of the output signal mux(1). With this operation, the output signal dout(0) transitions to Low and the output signal dout(1) transitions to High, and the Low and High states are held until time T02a. During the same period, the output signals dout(k) in the other rows are held Low.

From the time T01a to the time T02a, the pixel drive pulse performs an operation similar to the operation during the time T00a to the time T01a except that the selected row is different. As a result, the signals based on the electric charges of the photoelectric conversion elements 301 of pixels P(0, 1) to (m, 1) are read out.

Thereafter, in a similar way, the signals based on the electric charges of the photoelectric conversion elements 301 are read out while changing the selected row. Finally, the signals based on the electric charges of the photoelectric conversion elements 301 of pixels P(0, n) to (m, n) are read out. In this way, the vertical scan unit 103 drives a plurality of pixels in units of rows using the output signal dout(1) of the holding unit 4111 as a scanning signal. In other words, the scan unit 103 is configured to drive the plurality of pixels based on a scanning signal in a row-by-row unit.

[Drive Method 1-2: Test Operation of Vertical Scan Unit]

Figure 5:
FIG. 5 is a timing chart illustrating an example of a test operation of the vertical scan unit according to the first exemplary embodiment.

Next, a test operation of the vertical scan unit 103 will be described. FIG. 5 is a timing chart illustrating an example of the operations of the vertical scan unit 103 and the pixel unit 104 illustrated in FIG. 3. In the example illustrated in the timing chart of FIG. 5, a holding unit 41k1 and a signal generation unit 41k2 can be inspected. In particular, in the present exemplary embodiment, one signal generation unit 41k2 generates a plurality of control signals. Inspection can be performed to confirm that the plurality of control signals is correctly generated.

First, the signal test_en is High during the entire period. Accordingly, an input signal tin(k) is selected under control of the scanning signal selection unit 41k3 in each row and is output as the output signal mux(k). An input signal tin, i.e., the logical sum (OR) of a control signal ipsel(k−1), a control signal ipres_b(k−1), and a control signal iptx(k−1) is the output signal mux(k) (k is an arbitrary integer that satisfies the following formula: 0≤k≤n). However, as an output signal mux(0) in the zeroth row, the vertical scanning start signals vstr are selected.

At the time T00, the test operation is started. The CPU 101 inputs the vertical synchronization signal VD and the horizontal synchronization signal HD to the control unit 102. At the same time, the vertical scanning start signals vstr are input.

Next, at the time T00a, the clock signal clk transitions to High, and the holding unit 4101 stores High of an input signal tin(0) (=the vertical scanning start signals vstr). With this operation, the output signal dout(0) transitions to High and is held until the time T01a. During the same period, the output signals dout(k) in the other rows are held Low. Accordingly, only the signal generation unit 4102 that receives the output signal dout(0) can generate the control signals.

The pixel drive pulse in a similar time zone, i.e., from the time T00a to the time T01a will be described. Only the control signal ipsel(0) among the plurality of control signals ipsel(k) transitions according to the waveform of the pulse psel. Further, in this example, since a logic circuit that generates the control signals ipsel(k) is inspected, only the control signals ipsel(k) are required to be transmitted. Accordingly, the pulse pres_b and the pulse ptx are constantly fixed to Low, and the control signals ipres_b(k) and the control signals iptx(k) are constantly fixed to Low.

Next, at the time T01a, the clock signal clk transitions to High, and the holding unit 4101 stores Low of the vertical scanning start signals vstr. At the same time, the holding unit 4111 stores High of the input signal tin(1) (=the control signal ipsel(0)). With this operation, the output signal dout(0) transitions to Low and the output signal dout(1) transitions to High, and the Low and High states are held until the time T02a. During the same period, the output signals dout(k) in the other rows are held Low.

From the time T01a to the time T02a, the pixel drive pulse performs an operation similar to the operation during the time T00a to the time T01a except that the selected row is different. Thereafter, in a similar way, the holding unit 41k1 is rewritten by using the control signal ipsel(k−1) while changing the selected row.

Finally, a control signal ipsel(n−1) generated by a row drive unit 41(n−1) in the (n−1)th row is input to a holding unit 41n1 of a row drive unit 41n in the nth row. Accordingly, a waveform of a control signal ipsel(n) can be observed at an output terminal test_out from time T0na to time T0(n+1)a. Here, in a case where the waveform of the signal output to the output terminal test_out does not match an expected waveform, it can be determined that a failure has occurred in any of the rows.

The holding unit 41k1 and the logic circuit that generates the control signal ipsel(k) of the signal generation unit 41k2 can be inspected as described above. Similarly, in a case where a logic circuit that generates the control signal ipres_b(k) is inspected, only the pulse pres_b is operated, and the pulse psel and the pulse ptx are fixed to Low. Similarly, in a case where a logic circuit that generates the control signal iptx(k) is inspected, only the pulse ptx is operated, and the pulse psel and the pulse pres_b are fixed to Low. The holding unit 41k1 and the signal generation unit 41k2 in all the rows can be inspected as described above.

Thus, according to the present exemplary embodiment, the test coverage rate of the scan circuit can be improved.

A second exemplary embodiment of the imaging apparatus according to the present invention will be described focusing on differences from the first exemplary embodiment. The imaging apparatus of the present exemplary embodiment is an imaging apparatus. In the present exemplary embodiment, the vertical scan unit 103 performs control by an address decoder. The overall block diagram, column configuration, and pixel circuit are similar to those in the first exemplary embodiment. In other words, disclosure in FIG. 1 and FIGS. 2A and 2B, and description thereof all apply to the second exemplary embodiment.

[Scan Circuit]

Figure 6:
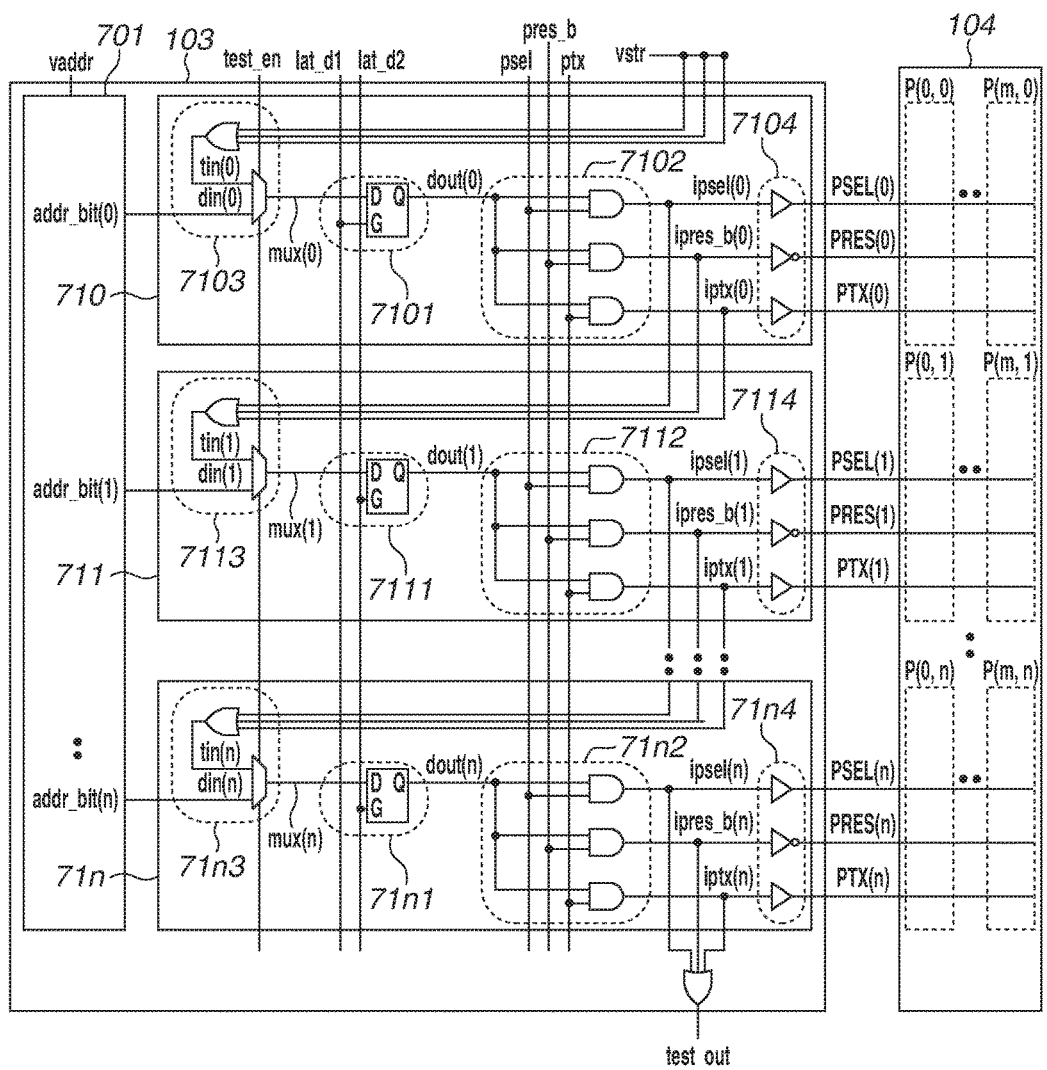
FIG. 6 is a block diagram schematically illustrating a configuration example of a vertical scan unit according to a second exemplary embodiment.

FIG. 6 is a block diagram illustrating a configuration example of the vertical scan unit 103 according to the present exemplary embodiment. The vertical scan unit 103 includes an address decoder unit 701 and row drive units 710 to 71n. The address decoder unit 701 decodes an address signal vaddr generated by the control unit 102 into scanning signals addr_bit(0) to (n). The vertical scan unit 103 of the present exemplary embodiment drives a plurality of pixels in units of rows on the basis of the scanning signals addr_bit(0) to (n). In other words, the scan unit 103 is configured to drive the plurality of pixels based on a scanning signal in a row-by-row unit.

A configuration of the row drive unit 711 in the first row will be described as an example. The same applies to the row drive units in other rows. The row drive unit 711 includes a holding unit 7111, a signal generation unit 7112, a scanning signal selection unit 7113, and a level shift unit 7114. The row drive unit 711 supplies the control signals to a plurality of control lines connected to pixels in corresponding one row.

The holding unit 7111 includes a D latch circuit. The holding unit 7111 stores a level of an output signal mux(1) at timing when a latch signal lat_d2 generated by the control unit 102 becomes a High level. Holding units 7101, 7121, 7141, . . . in even rows receive a latch signal lat_d1. The holding units 7111, 7131, 7151, . . . in odd rows receive the latch signal lat_d2.

The signal generation unit 7112 performs a logical operation between an output signal dout(1) of the holding unit 7111 and a pulse psel generated by the control unit 102 to generate a control signal ipsel(1). Further, the signal generation unit 7112 performs a logical operation between the output signal dout(1) and a pulse pres_b to generate a control signal ipres_b(1). Further, similarly, the signal generation unit 7112 performs a logical operation between the output signal dout(1) and a pulse ptx to generate a control signal iptx(1).

A configuration of the level shift unit 7114 is similar to that in the first exemplary embodiment. The level shift unit 7114 is a buffer circuit that shifts a level of an input signal. The level shift unit 7114 inverts the input signal as necessary. The control signal ipsel(1) is output as a row selection signal PSEL(1) by the level shift unit 7114 to the control line connected to the pixel. Similarly, the control signal ipres_b(1) and the control signal iptx(1) are respectively output as a pixel unit reset signal PRES(1) and a pixel transfer signal PTX(1) to the control lines connected to the pixel.

The scanning signal addr_bit(1) is input to the row drive unit 711 in the first row. For convenience, the scanning signal addr_bit(1) input to the row drive unit 711 in the first row is referred to as an input signal din(1). The same applies to other rows. Further, a control signal ipsel(0), a control signal ipres_b(0), and a control signal iptx(0) generated by the signal generation unit 7102 in the zeroth row are input to the row drive unit 711 in the first row. An input signal tin(1) is generated by calculating the logical sum (OR) of these control signals.

The scanning signal selection unit 7113 selects one of the input signal din(1) and the input signal tin(1), and outputs the selected one as the output signal mux(1) to the holding unit 7111 in the following stage. In a case where a signal test_en generated by the control unit 102 is in a Low level, the input signal din(1) is output as the output signal mux(1). In this case, the row drive unit 711 operates on the basis of the scanning signal addr_bit(1) supplied from the address decoder unit 701.

Further, in a case where the signal test_en is in a High level, the input signal tin(1) is output as the output signal mux(1). Here, the input signal tin(1) is based on the control signals generated by the signal generation unit 7102 in the zeroth row. In other words, the input signal tin(1) is an inspection signal indicating whether the row drive unit 710 in the zeroth row in the preceding stage is operating normally.

The scanning signal selection unit 7113 illustrated in FIG. 6 is an example, and a circuit configuration of the scanning signal selection unit 7113 can be changed. For example, instead of calculating the logical sum (OR) of the control signals, the logical operation such as the exclusive logical sum (EXOR) may be used. Alternatively, instead of performing the logical operation, a multiplexer may be used. Further, although the holding unit of the present exemplary embodiment uses the D latch circuit, the present invention is not limited to the use of the D latch circuit, and other storage elements may be used. For example, a flip-flop circuit may be used instead of the D latch circuit.

[Drive Method 2-1: Readout Operation of Photoelectric Conversion Element]

Figure 7:
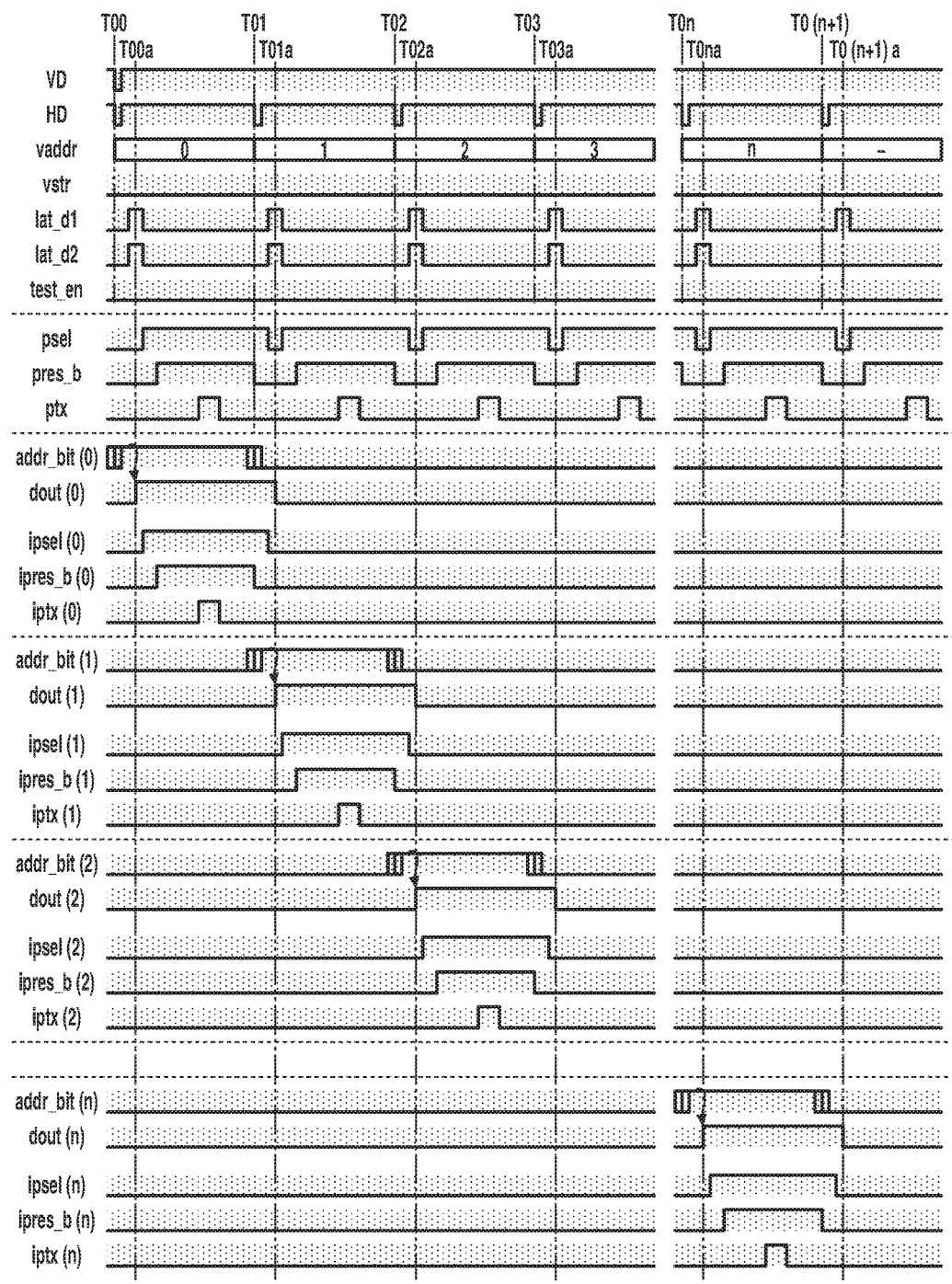
FIG. 7 is a timing chart illustrating an example of a readout operation of a photoelectric conversion element according to the second exemplary embodiment.

Hereinafter, a method of driving the imaging apparatus according to the present exemplary embodiment will be described. First, driving for reading out signals based on electric charges generated in the photoelectric conversion element 301 will be described. FIG. 7 is a timing chart illustrating an example of the operations of the vertical scan unit 103 and the pixel unit 104 illustrated in FIG. 6.

First, the signal test_en is Low during the entire period. Accordingly, an input signal din(k) (=a scanning signal addr_bit(k)) is selected under control of a scanning signal selection unit 71k3 in each row and is output as an output signal mux(k) (k is an arbitrary integer that satisfies the following formula: 0≤k≤n).

At time T00, a readout operation of the photoelectric conversion element 301 is started. The CPU 101 inputs the vertical synchronization signal VD and the horizontal synchronization signal HD to the control unit 102. Further, by inputting the address signal vaddr=0, the scanning signal addr_bit(0) transitions to a High level and other scanning signals addr_bit(k) transition to a Low level.

Next, at time T00a, the latch signal lat_d1 and the latch signal lat_d2 transition to High, and the holding unit 7101 stores the High level of the scanning signal addr_bit(0). With this operation, an output signal dout(0) transitions to High and is held until time T01a. Further, during the same period, since the scanning signals addr_bit(k) in the other rows are in the Low level, output signals dout(k) are held Low. Accordingly, only the signal generation unit 7102 that receives the output signal dout(0) can generate the signals.

The pixel drive pulse in a similar time zone, i.e., from the time T00a to the time T01a will be described. Only the control signal ipsel(0) in the zeroth row among a plurality of control signals ipsel(k) transitions according to a waveform of the pulse psel. Accordingly, in pixels P(0, 0) to (m, 0), the row selection units 305 become conductive and the pixels P(0, 0) to (m, 0) are connected to the vertical output line 202. Further, pixels in other rows are not connected to the vertical output line 202.

Similarly, only the control signal ipres_b(0) among a plurality of control signals ipres_b(k) transitions according to a waveform of the pulse pres_b. A pixel unit reset signal PRES(k) has an inverted waveform of the control signal ipres_b(k). Thus, in the pixels P(0, 0) to (m, 0), resetting of the FD is canceled while the control signal ipres_b(0) is High. In other words, the FD is in a floating state. Further, in the pixels in the other rows, the FD is held in a reset state.

Similarly, only the control signal iptx(0) among a plurality of control signals iptx(k) transitions according to a waveform of the pulse ptx. Accordingly, the signals based on the electric charges of the photoelectric conversion elements 301 of the pixels P(0, 0) to (m, 0) can be read out via the vertical output line 202.

Next, at time T01, by inputting the address signal vaddr=1, the scanning signal addr_bit(1) transitions to a High level and the other scanning signals addr_bit(k) transition to a Low level.

Next, at the time T01a, the latch signal lat_d1 and the latch signal lat_d2 transition to High, and the holding unit 7101 stores Low of the scanning signal addr_bit(0). At the same time, the holding unit 7111 stores High of the scanning signal addr_bit(1). With this operation, the output signal dout(0) transitions to Low and the output signal dout(1) transitions to High, and the Low and High states are held until the time T02a. During the same period, the output signals dout(k) in the other rows are held Low.

From the time T01a to the time T02a, the pixel drive pulse performs an operation similar to the operation during the time T00a to the time T01a except that the selected row is different. As a result, the signals based on the electric charges of the photoelectric conversion elements 301 of pixels P(0, 1) to (m, 1) are read out.

Thereafter, in a similar way, the signals based on the electric charges of the photoelectric conversion elements 301 are read out while changing the selected row. Finally, the signals based on the electric charges of the photoelectric conversion elements 301 of pixels P(0, n) to (m, n) are read out. In this manner, the vertical scan unit 103 drives a plurality of pixels in units of rows on the basis of the address signal vaddr and the scanning signals addr_bit(0) to (n). In other words, the scan unit 103 is configured to drive the plurality of pixels based on a scanning signal in a row-by-row unit.

[Drive Method 2-2: Test Operation of Vertical Scan Unit]

Figure 8:
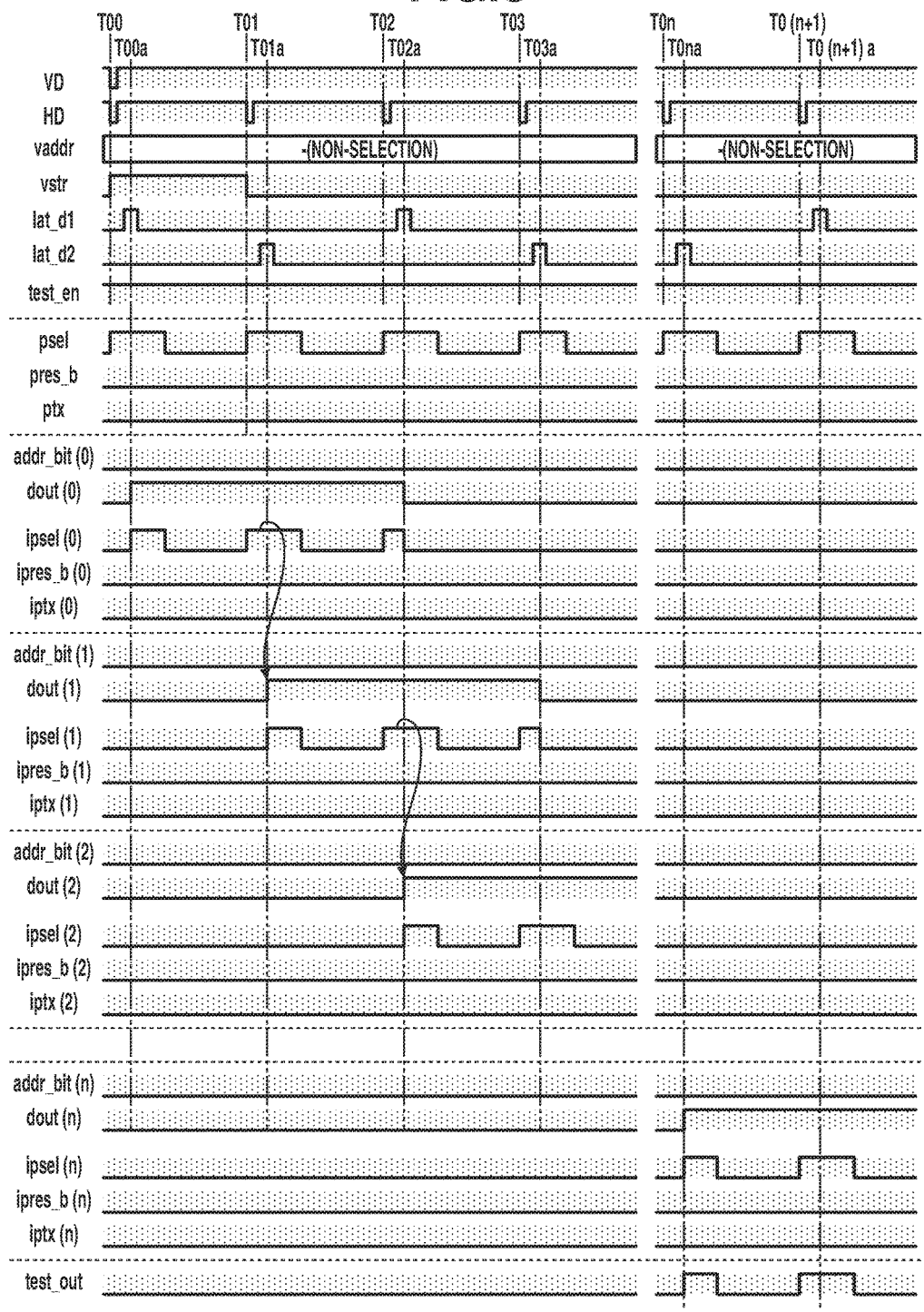
FIG. 8 is a timing chart illustrating an example of a test operation of the vertical scan unit according to the second exemplary embodiment.

Next, a test operation of the vertical scan unit 103 will be described. FIG. 8 is a timing chart illustrating an example of the operations of the vertical scan unit 103 and the pixel unit 104 illustrated in FIG. 6. In the example illustrated in the timing chart of FIG. 8, a holding unit 71k1 and a signal generation unit 71k2 can be inspected. In particular, in the present exemplary embodiment, one signal generation unit 71k2 generates a plurality of control signals. Inspection can be performed to confirm that the plurality of control signals is correctly generated.

First, the signal test_en is High during the entire period. Accordingly, an input signal tin(k) is selected under control of the scanning signal selection unit 71k3 in each row and is output as the output signal mux(k). More specifically, the logical sum (OR) of a control signal ipsel(k−1), a control signal ipres_b(k−1), and a control signal iptx(k−1) is the output signal mux(k) (here, k is an arbitrary integer that satisfies the following formula: 0≤k≤n). However, as an output signal mux(0) in the zeroth row, vertical scanning start signals vstr are selected. On the other hand, none of the scanning signals addr_bit(k) is input to the holding unit 71k1.

At the time T00, the test operation is started. The CPU 101 inputs the vertical synchronization signal VD and the horizontal synchronization signal HD to the control unit 102. At the same time, the vertical scanning start signals vstr are input.

Next, at the time T00a, the latch signal lat_d1 transitions to High in a pulsed way, and the holding unit 7101 stores High of an input signal tin(0) (=the vertical scanning start signals vstr). With this operation, the output signal dout(0) transitions to High and is held until the next timing (time T02a) when the latch signal lat_d1 becomes High. Accordingly, the signal generation unit 7102 that receives the output signal dout(0) can generate the signals during the period from the time T00a to the time T02a.

The pixel drive pulse in a similar time zone, i.e., from the time T00a to the time T02a will be described. During this time zone, the control signal ipsel(0) transitions according to the waveform of the pulse psel. Further, in this example, since a logic circuit that generates the control signals ipsel (k) is inspected, only the control signals ipsel(k) are required to be transmitted. Accordingly, the pulse pres_b and the pulse ptx are constantly fixed to Low, and the control signals ipres_b(k) and the control signals iptx(k) are constantly fixed to Low.

Next, at the time T01a, the latch signal lat_d2 transitions to High in a pulsed way, and the holding unit 7111 stores High of the input signal tin(1) (=the control signal ipsel(0)). With this operation, the output signal dout(1) transitions to High and is held until the next timing (time T03a) when the latch signal lat_d2 becomes High.

From the time T01a to the time T03a, the pixel drive pulse performs an operation similar to the operation during the time T00a to the time T02a except that the selected row is different.

Next, at the time T02a, the latch signal lat_d1 transitions to High, and the holding unit 7101 stores Low of the input signal tin(0) (=the vertical scanning start signals vstr). At the same time, the holding unit 7111 stores High of an input signal tin(2) (=the control signal ipsel(1)). With this operation, an output signal dout(2) transitions to High and is held until the next timing (time T04a) when the latch signal lat_d1 becomes High.

From the time T02a to the time T04a, the pixel drive pulse performs an operation similar to the operation during the time T00a to the time T02a except that the selected row is different. Thereafter, in a similar way, the holding unit 71k1 is rewritten by using the control signal ipsel(k−1) while changing the selected row.

Finally, a control signal ipsel(n−1) generated by a row drive unit 71(n−1) in the (n−1)th row is input to a holding unit 71n1 of a row drive unit 71n in the nth row. Further, a waveform of a control signal ipsel(n) can be observed at an output terminal test_out from time T0na to time T0(n+2)a. Here, in a case where the waveform of the signal output to the output terminal test_out does not match an expected waveform, it can be determined that a failure has occurred in any of the rows.

The holding unit 71k1 and the logic circuit that generates the control signal ipsel(k) of the signal generation unit 71k2 can be inspected as described above. Similarly, in a case where a logic circuit that generates the control signal ipres_b (k) is inspected, only the pulse pres_b is operated, and the pulse psel and the pulse ptx are fixed to Low. Similarly, in a case where a logic circuit that generates the control signal iptx(k) is inspected, only the pulse ptx is operated, and the pulse psel and the pulse pres_b are fixed to Low. The holding unit 71k1 and the signal generation unit 71k2 in all the rows can be inspected as described above.

Thus, according to the present exemplary embodiment, the test coverage rate of the scan circuit can be improved.

A third exemplary embodiment of the imaging apparatus according to the present invention will be described focusing on differences from the first and second exemplary embodiments. The imaging apparatus of the present exemplary embodiment is an imaging apparatus. In the present exemplary embodiment, the vertical scan unit 103 performs control by an address decoder. Further, each holding unit of the vertical scan unit 103 includes an SR latch circuit and a D latch circuit. The overall block diagram, column configuration, and pixel circuit are similar to those in the first exemplary embodiment. In other words, disclosure in FIG. 1 and FIGS. 2A and 2B, and description thereof all apply to the third exemplary embodiment. In other words, the scan means 103 is configured to drive the plurality of pixels based on a scanning signal in a row-by-row unit.

[Scan Circuit]

Figure 9:
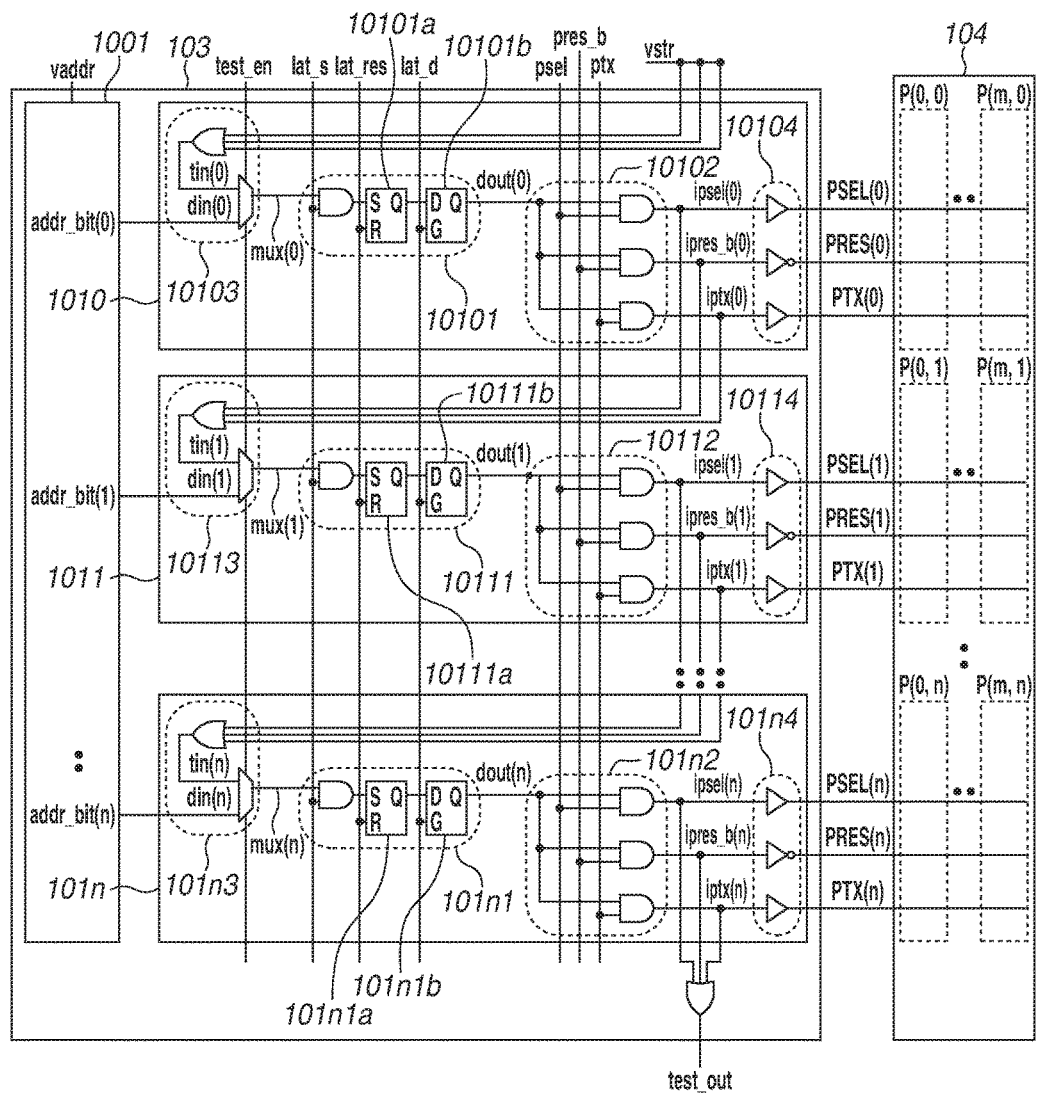
FIG. 9 is a block diagram schematically illustrating a configuration example of a vertical scan unit according to a third exemplary embodiment.

FIG. 9 is a block diagram illustrating a configuration example of the vertical scan unit 103 according to the present exemplary embodiment. The vertical scan unit 103 includes an address decoder unit 1001 and row drive units 1010 to 101n. The address decoder unit 1001 decodes an address signal vaddr generated by the control unit 102 into scanning signals addr_bit(0) to (n). The vertical scan unit 103 of the present exemplary embodiment drives a plurality of pixels in units of rows on the basis of the scanning signals addr_bit(0) to (n).

A configuration of the row drive unit 1011 in the first row will be described as an example. The same applies to the row drive units in other rows. The row drive unit 1011 includes a holding unit 10111, a signal generation unit 10112, a scanning signal selection unit 10113, and a level shift unit 10114. The row drive unit 1011 supplies control signals to a plurality of control lines connected to pixels in corresponding one row.

The holding unit 10111 includes an AND gate that calculates the logical product (AND) of an output signal mux(1) and a latch signal lat_s, an SR latch circuit 10111a as a first holding unit, and a D latch circuit 10111b as a second holding unit. When a latch signal lat_res generated by the control unit 102 is High, the SR latch circuit 10111a is reset, and an output signal srq(1) output from a Q terminal of the SR latch circuit 10111a transitions to Low. When the latch signal lat_s generated by the control unit 102 is High and a level of the output signal mux(1) is High, the SR latch circuit 10111a is set and the output signal srq(1) transitions to High. When a latch signal lat_d generated by the control unit 102 is High, the D latch circuit 10111b stores an output level (a level of the output signal srq(1)) of the SR latch circuit 10111a.

The signal generation unit 10112 performs a logical operation between an output signal dout(1) of the holding unit 10111 and a pulse psel generated by the control unit 102 to generate a control signal ipsel(1). Further, the signal generation unit 10112 performs a logical operation between the output signal dout(1) and a pulse pres_b to generate a control signal ipres_b(1). Further, in a similar way, the signal generation unit 10112 performs a logical operation between the output signal dout(1) and a pulse ptx to generate a control signal iptx(1).

A configuration of the level shift unit 10114 is the same as those in the first and second exemplary embodiments. The level shift unit 10114 is a buffer circuit that shifts a level of an input signal. The level shift unit 10114 inverts the input signal as necessary. The control signal ipsel(1) is output as a row selection signal PSEL(1) by the level shift unit 10114 to the control line connected to the pixel. Similarly, the control signal ipres_b(1) and the control signal iptx(1) are respectively output as a pixel unit reset signal PRES(1) and a pixel transfer signal PTX(1) to the control lines connected to the pixel.

The scanning signal addr_bit(1) is input to the row drive unit 1011 in the first row. For convenience, the scanning signal addr_bit(1) input to the row drive unit 1011 in the first row is referred to as an input signal din(1). The same applies to other rows. Further, a control signal ipsel(0), a control signal ipres_b(0), and a control signal iptx(0) generated by a signal generation unit 10102 in the zeroth row are input to the row drive unit 1011 in the first row. An input signal tin(1) is generated by calculating the logical sum (OR) of these control signals.

The scanning signal selection unit 10113 selects one of the input signal din(1) and the input signal tin(1), and outputs the selected one as the output signal mux(1) to the holding unit 10111 in the following stage. In a case where a signal test_en generated by the control unit 102 is in a Low level, the input signal din(1) is output as the output signal mux(1). In this case, the row drive unit 1011 operates on the basis of the scanning signal addr_bit(1) supplied from the address decoder unit 1001.

Further, in a case where the signal test_en is in a High level, the input signal tin(1) is output as the output signal mux(1). Here, the input signal tin(1) is based on the control signals generated by the signal generation unit 10102 in the zeroth row. In other words, the input signal tin(1) is an inspection signal indicating whether the row drive unit 1010 in the zeroth row in the preceding stage is operating normally.

The scanning signal selection unit 10113 illustrated in FIG. 9 is an example, and a circuit configuration of the scanning signal selection unit 10113 can be changed. For example, instead of calculating the logical sum (OR) of the control signals, the logical operation such as the exclusive logical sum (EXOR) may be used. Alternatively, instead of performing the logical operation, a multiplexer may be used. Further, a combination of the SR latch circuit and the D latch circuit is illustrated as an example of the holding unit 10111. However, a configuration of the holding unit 10111 can be changed. For example, one or both of the SR latch circuit and the D latch circuit may be replaced by a flip-flop circuit.

[Drive Method 3-1: Readout Operation of Photoelectric Conversion Element]

Figure 10:
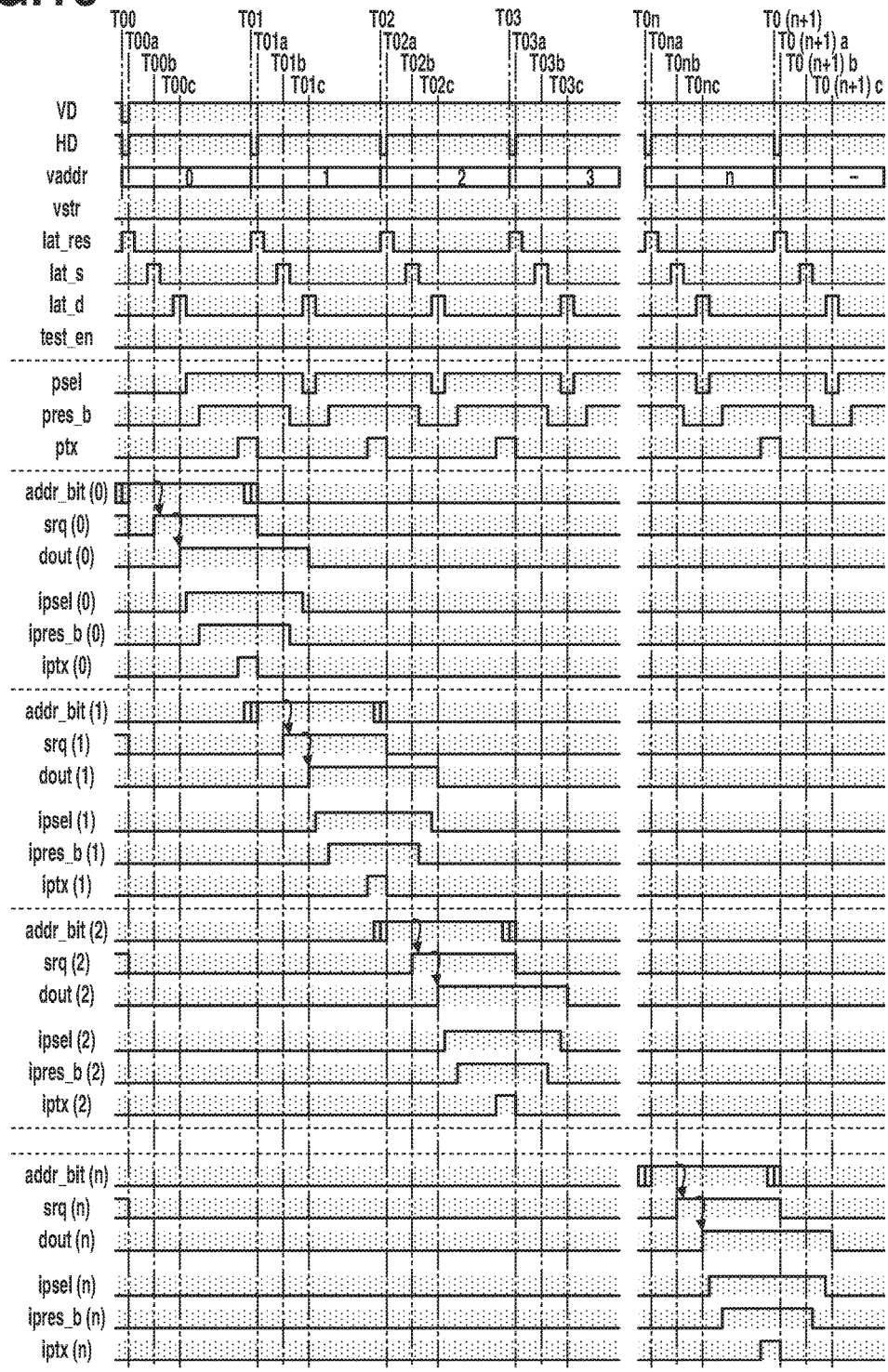
FIG. 10 is a timing chart illustrating an example of a readout operation of a photoelectric conversion element according to the third exemplary embodiment.

Hereinafter, a method of driving the imaging apparatus according to the present exemplary embodiment will be described. First, driving for reading out signals based on electric charges generated in the photoelectric conversion element 301 will be described. FIG. 10 is a timing chart illustrating an example of the operations of the vertical scan unit 103 and the pixel unit 104 illustrated in FIG. 9.

First, the signal test_en is Low during the entire period. Accordingly, an input signal din(k) (=a scanning signal addr_bit(k)) is selected under control of a scanning signal selection unit 101k3 in each row and is output as an output signal mux(k) (k is an arbitrary integer that satisfies the following formula: 0≤k≤n).

At time T00, a readout operation of the photoelectric conversion element 301 is started. The CPU 101 inputs the vertical synchronization signal VD and the horizontal synchronization signal HD to the control unit 102. Further, by inputting the address signal vaddr=0, the scanning signal addr_bit(0) transitions to a High level and other scanning signals addr_bit(k) transition to a Low level.

Next, at time T00a, the latch signal lat_res temporarily transitions to High. Accordingly, SR latch circuits 101k1a in all the rows are reset, and output signals srq(k) of the SR latch circuits 101k1a transition to Low.

Next, at time T00b, the latch signal lat_s temporarily transitions to High. At this time, since only the scanning signal addr_bit(0) is High, only an SR latch circuit 10101a in the zeroth row is set, and an output signal srq(0) of the SR latch circuit 10101a in the zeroth row transitions to High. Since the SR latch circuits 101k1a in the other rows are not set, the output signals srq(k) of the SR latch circuits 101k1a are held Low.

Next, at time T00c, the latch signal lat_d temporarily transitions to High. At this time, a D latch circuit 10101b stores the High level of the output signal srq(0). With this operation, an output signal dout(0) transitions to High and is held until time T01c. Further, during the same period, since the output signals srq(k) of the SR latch circuits 101k1a in the other rows are in the Low level, the output signals dout(k) in the rows other than the zeroth row are held Low. Accordingly, only the signal generation unit 10102 that receives the output signal dout(0) can generate the signals.

A pixel drive pulse in a similar time zone, i.e., from the time T00c to the time T01c will be described. Only the control signal ipsel(0) in the zeroth row among a plurality of control signals ipsel(k) transitions according to a waveform of the pulse psel. Accordingly, in pixels P(0, 0) to (m, 0), the row selection units 305 become conductive and the pixels P(0, 0) to (m, 0) are connected to the vertical output line 202. Further, pixels in other rows are not connected to the vertical output line 202.

Similarly, only the control signal ipres_b(0) among a plurality of control signals ipres_b(k) transitions according to a waveform of the pulse pres_b. A pixel unit reset signal PRES(k) has an inverted waveform of the control signal ipres_b(k). Thus, in the pixels P(0, 0) to (m, 0), resetting of the FD is canceled while the control signal ipres_b(0) is High. In other words, the FD is in a floating state. Further, in the pixels in the other rows, the FD is held in a reset state.

Similarly, only the control signal iptx(0) among a plurality of control signals iptx(k) transitions according to a waveform of the pulse ptx. Accordingly, the signals based on the electric charges of the photoelectric conversion elements 301 of the pixels P(0, 0) to (m, 0) can be read out via the vertical output line 202.

Next, at time T01, by inputting the address signal vaddr=1, the scanning signal addr_bit(1) transitions to a High level and the other scanning signals addr_bit(k) transition to a Low level.

Next, at time T01a, the latch signal lat_res temporarily transitions to High. Accordingly, the SR latch circuits 101k1a in all the rows are reset, and the output signals srq(k) of the SR latch circuits 101k1a transition to Low.

Next, at time T01b, the latch signal lat_s temporarily transitions to High. At this time, since only the scanning signal addr_bit(1) is High, only the SR latch circuit 10111a is set, and the output signal srq(1) of the SR latch circuit 10111a transitions to High. Since the SR latch circuits 101k1a in the other rows are not set, the output signals srq(k) of the SR latch circuits 101k1a are held Low.

Next, at the time T01c, the latch signal lat_d temporarily transitions to High. At this time, the D latch circuit 10111b stores the High level of the output signal srq(1). With this operation, the output signal dout(1) transitions to High and is held until time T02c. Further, during the same period, since the output signals srq(k) of the SR latch circuits 101k1a in the other rows are in the Low level, the output signals dout(k) in the rows other than the first row are held Low. Accordingly, only the signal generation unit 10112 that receives the output signal dout(1) can generate the signals.

From the time T01c to time T02, the pixel drive pulse performs an operation similar to the operation during the time T00c to the time T01 except that the selected row is different. As a result, the signals based on the electric charges of the photoelectric conversion elements 301 of pixels P(0, 1) to (m, 1) are read out.

Thereafter, in a similar way, the photoelectric conversion elements 301 are read out while changing the selected row. Finally, the photoelectric conversion elements 301 of the pixels P(0, n) to (m, n) are read out.

[Drive Method 3-2: Test Operation of Vertical Scan Unit]

Figure 11:
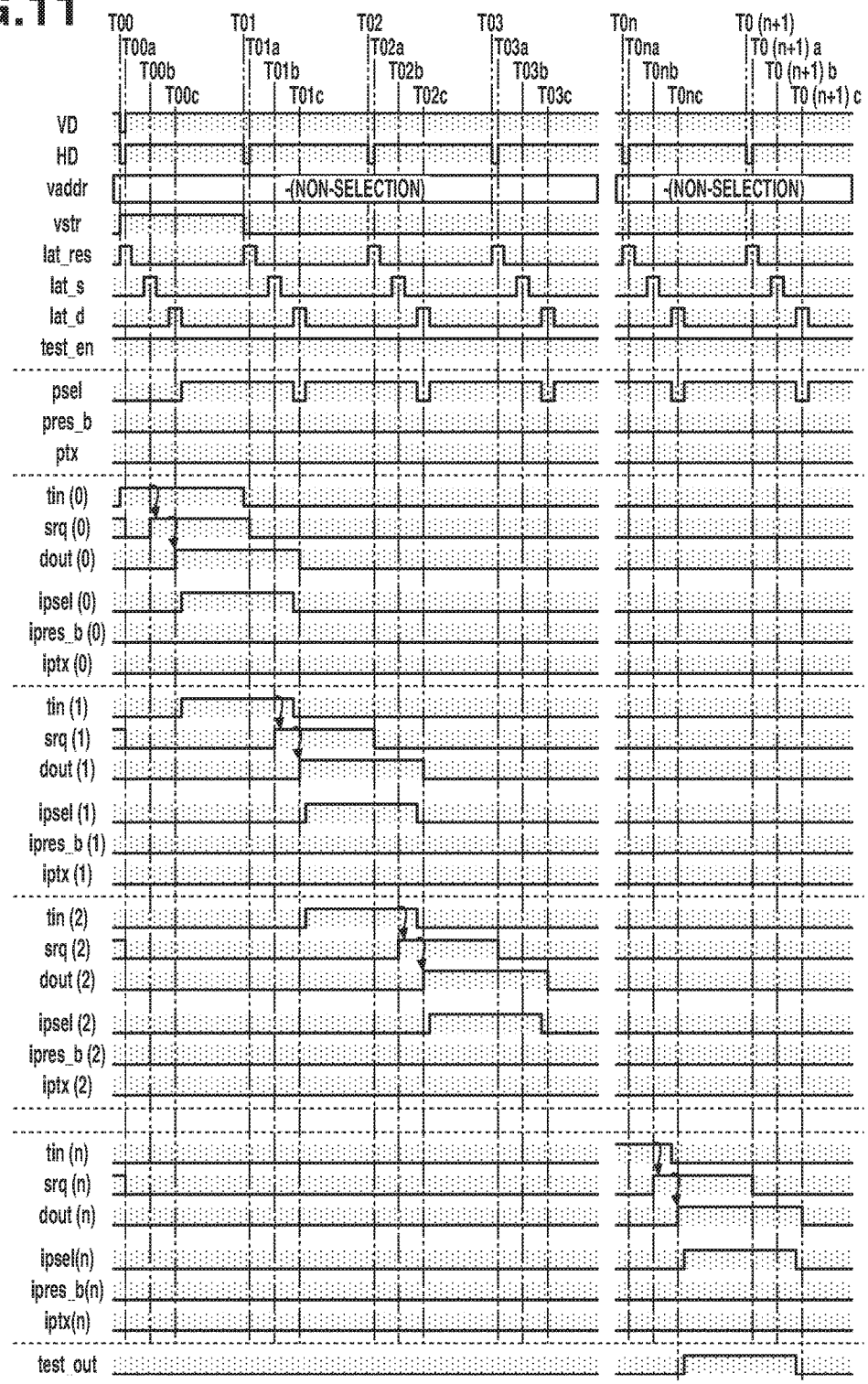
FIG. 11 is a timing chart illustrating an example of a test operation of the vertical scan unit according to the third exemplary embodiment.

Next, a test operation of the vertical scan unit 103 will be described. FIG. 11 is a timing chart illustrating an example of the operations of the vertical scan unit 103 and the pixel unit 104 illustrated in FIG. 9. In the example illustrated in the timing chart of FIG. 11, a holding unit 101k1 and a signal generation unit 101k2 can be inspected. In particular, in the present exemplary embodiment, one signal generation unit 101k2 generates a plurality of control signals. Inspection can be performed to confirm that the plurality of control signals is correctly generated.

First, the signal test_en is High during the entire period. Accordingly, an input signal tin(k) is selected under control of the scanning signal selection unit 101k3 in each row and is output as the output signal mux(k). More specifically, the logical sum (OR) of a control signal ipsel(k−1), a control signal ipres_b(k−1), and a control signal iptx(k−1) is the output signal mux(k) (here, k is an arbitrary integer that satisfies the following formula: 0≤k≤n). However, vertical scanning start signals vstr are selected as an output signal mux(0) in the zeroth row. On the other hand, none of the scanning signals addr_bit(k) is input to the holding unit 101k1.

At the time T00, the test operation is started. The CPU 101 inputs the vertical synchronization signal VD and the horizontal synchronization signal HD to the control unit 102. At the same time, the vertical scanning start signals vstr are input.

Next, at the time T00a, the latch signal lat_res transitions to High in a pulsed way. Accordingly, the SR latch circuits 101k1a in all the rows are reset, and the output signals srq(k) of the SR latch circuits 101k1a transition to Low.

Next, at the time T00b, the latch signal lat_s transitions to High in a pulsed way. At this time, since only an input signal tin(0) in the zeroth row is High, only the SR latch circuit 10101a in the zeroth row is set, and the output signal srq(0) of the SR latch circuit 10101a transitions to High. Since the SR latch circuits 101k1a in the other rows are not set, the output signals srq(k) of the SR latch circuits 101k1a are held Low.

Next, at the time T00c, the latch signal lat_d transitions to High in a pulsed way. At this time, the D latch circuit 10101b stores the High level of the output signal srq(0). With this operation, the output signal dout(0) transitions to High and is held until the time T01c. Further, during the same period, since the output signals srq(k) of the SR latch circuits 101k1a in the other rows are in the Low level, the output signals dout(k) in the rows other than the zeroth row are held Low. Accordingly, only the signal generation unit 10102 that receives the output signal dout(0) can generate the control signals.

The pixel drive pulse in a similar time zone, i.e., from the time T00c to the time T01c will be described. Only the control signal ipsel(0) among the plurality of control signals ipsel(k) transitions according to the waveform of the pulse psel. Further, in this example, since a logic circuit that generates the control signals ipsel(k) is inspected, only the control signals ipsel(k) are required to be transmitted. Accordingly, the pulse pres_b and the pulse ptx are constantly fixed to Low, and the control signals ipres_b(k) and the control signals iptx(k) are constantly fixed to Low.

Next, at the time T01a, the latch signal lat_res transitions to High in a pulsed way. Accordingly, the SR latch circuits 101k1a in all the rows are reset, and the output signals srq(k) of the SR latch circuits 101k1a transition to Low.

Next, at the time T01b, the latch signal lat_s transitions to High in a pulsed way. At this time, since only the input signal tin(1) (=the control signal ipsel(0)) is High, only the SR latch circuit 10111a is set, and the output signal srq(1) of the SR latch circuit 10111a transitions to High. Since the SR latch circuits 101k1a in the other rows are not set, the output signals srq(k) of the SR latch circuits 101k1a are held Low.

Next, at the time T01c, the latch signal lat_d transitions to High in a pulsed way. At this time, the D latch circuit 10111b stores the High level of the output signal srq(1). With this operation, the output signal dout(1) transitions to High and is held until the time T02c. Further, during the same period, since the output signals srq(k) of the SR latch circuits 101k1a in the other rows are in the Low level, the output signals dout(k) in the rows other than the first row are held Low. Accordingly, only the signal generation unit 10112 that receives the output signal dout(1) can generate the signals.

From the time T01c to the time T02, the pixel drive pulse performs an operation similar to the operation during the time T00c to the time T01 except that the selected row is different. Thereafter, in a similar way, the holding unit 101k1 is rewritten by using the control signal ipsel(k−1) while changing the selected row.

Finally, a control signal ipsel(n−1) generated by a row drive unit 101(n−1) in the (n−1)th row is input to a holding unit 101n1 of a row drive unit 101n in the nth row. Further, from time T0nc to time T0(n+1)c, a waveform of a control signal ipsel(n) can be observed at an output terminal test_out. Here, in a case where the waveform of the signal output to the output terminal test_out does not match an expected waveform, it can be determined that a failure has occurred in any of the rows.

As described above, the SR latch circuit 101k1a and a D latch circuit 101k1b of the holding unit 101k1 and the logic circuit that generates the control signal ipsel(k) of the signal generation unit 101k2 can be inspected. Similarly, in a case where a logic circuit that generates the control signal ipres_b(k) is inspected, only the pulse pres_b is operated, and the pulse psel and the pulse ptx are fixed to Low. Similarly, in a case where a logic circuit that generates the control signal iptx(k) is inspected, only the pulse ptx is operated, and the pulse psel and the pulse pres_b are fixed to Low. The holding unit 101k1 and the signal generation unit 101k2 in all the rows can be inspected as described above.

Thus, according to the present exemplary embodiment, the test coverage rate of the scan circuit can be improved.

A fourth exemplary embodiment of the imaging apparatus according to the present invention will be described focusing on differences from the third exemplary embodiment. The imaging apparatus of the present exemplary embodiment is an imaging apparatus. In the third exemplary embodiment, a method of inspecting the holding unit 101k1 and the signal generation unit 101k2 included in the vertical scan unit 103 has been described. In addition thereto, in the present exemplary embodiment, the address decoder unit 1001 and the scanning signal selection unit 101k3 can also be inspected. The overall block diagram, column configuration, pixel circuit, and vertical scan unit are similar to those in the third exemplary embodiment. In other words, disclosure in FIG. 1 and FIGS. 2A and 2B, and description thereof all apply to the fourth exemplary embodiment. Further, the vertical scan unit 103 of the present exemplary embodiment is illustrated in FIG. 9. The entire description of FIG. 9 applies to the fourth exemplary embodiment.

[Drive Method 4-1: Readout Operation of Photoelectric Conversion Element]

Hereinafter, a method of driving the imaging apparatus according to the present exemplary embodiment will be described. An operation of reading out signals based on electric charges generated in the photoelectric conversion element 301 is similar to that in the third exemplary embodiment. More specifically, the signals based on the electric charges generated in the photoelectric conversion element 301 are read out on the basis of the timing chart of FIG. 10. For that reason, the detailed description will be omitted.

[Drive Method 4-2: Test Operation of Vertical Scan Unit]

Figure 12:
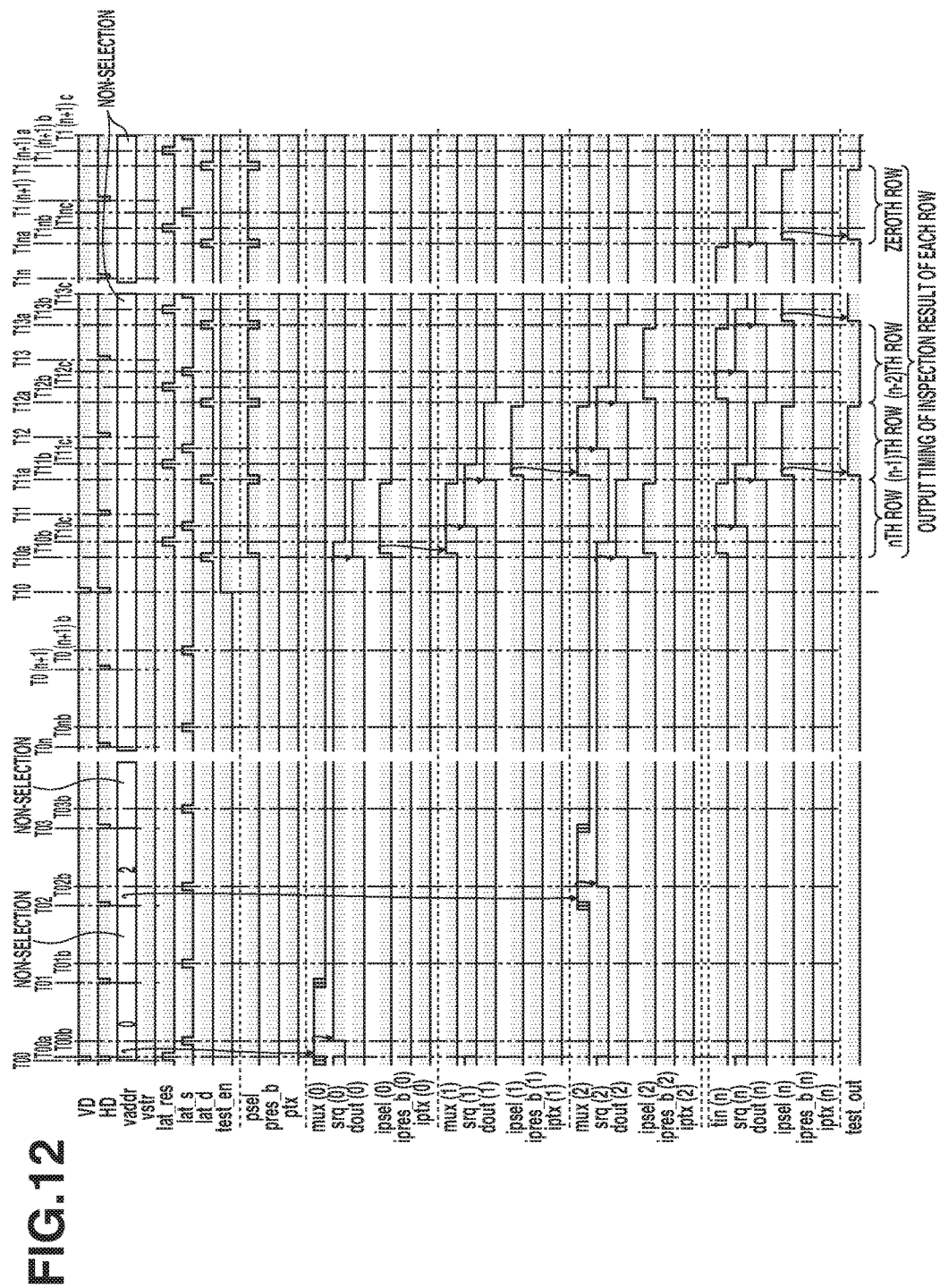
FIG. 12 is a timing chart illustrating an example of a test operation of a vertical scan unit according to a fourth exemplary embodiment.

Next, a test operation of the vertical scan unit 103 will be described. FIG. 12 is a timing chart illustrating an example of the operations of the vertical scan unit 103 and the pixel unit 104 illustrated in FIG. 9. In the example illustrated in the timing chart of FIG. 12, the holding unit 101k1 and the signal generation unit 101k2 can be inspected. Moreover, the address decoder unit 1001 and the scanning signal selection unit 101k3 can be inspected.

First, from time T00 to time T10, a setting operation to the SR latch circuit 101k1a is performed. It is not necessary to operate any of the pulses psel, pres_b, and ptx during this period. In other words, these pulses are held Low.

The signal test_en is set to Low during the period from the time T00 to the time T10. Accordingly, the input signal din(k) (=the scanning signal addr_bit(k)) is selected under control of the scanning signal selection unit 101k3 in each row and is output as the output signal mux(k) (k is an arbitrary integer that satisfies the following formula: 0≤k≤n).

At the time T00, the setting operation to the SR latch circuit 101k1a is started. The CPU 101 inputs the vertical synchronization signal VD and the horizontal synchronization signal HD to the control unit 102. Further, by inputting the address signal vaddr=0, the scanning signal addr_bit(0) transitions to a High level and other scanning signals addr_bit(k) transition to a Low level.

Next, at time T00a, the latch signal lat_res (temporarily) transitions to High in a pulsed way. Accordingly, the SR latch circuits 101k1a in all the rows are reset, and the output signals srq(k) of the SR latch circuits 101k1a transition to Low.

Next, at time T00b, the latch signal lat_s transitions to High in a pulsed way. At this time, since only the scanning signal addr_bit(0) is High, only the SR latch circuit 10101a in the zeroth row is set, and the output signal srq(0) of the SR latch circuit 10101a in the zeroth row transitions to High. Since the SR latch circuits 101k1a in the other rows are not set, the output signals srq(k) of the SR latch circuits 101k1a are held Low.

Next, at time T01b, the latch signal lat_s transitions to High in a pulsed way. At this time, a non-selection signal is input to the address signal vaddr, and all the scanning signals addr_bit(k) are in the Low level. Accordingly, none of the SR latch circuits 101k1a is additionally set.

Next, at time T02b, the latch signal lat_s transitions to High in a pulsed way. At this time, the address signal vaddr=2 is input, and only a scanning signal addr_bit(2) is in a High level. Accordingly, an SR latch circuit 10121a in the second row is additionally set, and an output signal srq(2) of the SR latch circuit 10121a in the second row transitions to High.

Thereafter, in a similar way, an SR latch circuit 10141a, an SR latch circuit 10161a, . . . in the even rows are additionally set, and corresponding output signals srq(4), srq(6), . . . transition to High.

At the time T10, output signals srq(2j) of the SR latch circuits in all the even rows are High and output signals srq(2j+1) of the SR latch circuits in all the odd rows are Low. More specifically, when viewed in order of rows, the output signal srq(k) in a High level and the output signal srq(k) in a Low level are alternately output.

Next, at or after the time T10, an inspection signal readout operation, i.e., the test operation is performed. In the present exemplary embodiment, an output signal sr1(k) output from the SR latch circuit 101k1a in each row is sequentially delivered to a row drive unit 101(k+1) in an adjacent row via the D latch circuit 101k1b and the signal generation unit 101k2. When the circuits operate normally, as a result, a High level and a Low level are alternately output from the last row (nth row).

At the time T10, the readout operation of the inspection signal is started. The CPU 101 inputs the vertical synchronization signal VD and the horizontal synchronization signal HD to the control unit 102. At this time, the signal test_en transitions to High. Accordingly, the input signal tin(k) is selected under control of the scanning signal selection unit 101k3 in each row and is output as the output signal mux(k). More specifically, the logical sum (OR) of the control signal ipsel(k−1), the control signal ipres_b(k−1), and the control signal iptx(k−1) is the output signal mux(k) (here, k is an arbitrary integer that satisfies the following formula: 0≤k≤n). However, the vertical scanning start signals vstr are selected as the output signal mux(0) in the zeroth row. On the other hand, none of the scanning signals addr_bit(k) is input to the holding unit 101k1.

Next, at time T10a, the latch signal lat_d transitions to High in a pulsed way. At this time, the D latch circuit 101k1b stores a level of the output signal srq(k) of the SR latch circuit 101k1a. At this time, the output signals srq(2j) of the SR latch circuits in the even rows are High and the output signals srq(2j+1) of the SR latch circuits in the odd rows are Low (0≤j). Thus, in the even rows, output signals dout(2j) transition to High and are held until time T11a. Further, during the same period, since the output signals srq(2j+1) in the odd rows are in the Low level, output signals dout(2j+1) are held Low.

The pixel drive pulse in the similar time zone, i.e., from the time T10a to the time T11a will be described. Only control signals ipsel(2j) in the even rows among the plurality of control signals ipsel(k) transition according to the waveform of the pulse psel. Further, in this example, since the logic circuit that generates the control signals ipsel(k) is inspected, only the control signals ipsel(k) are required to be transmitted. Accordingly, the pulse pres_b and the pulse ptx are constantly fixed to Low, and the control signals ipres_b(k) and the control signals iptx(k) are constantly fixed to Low.

Next, at time T10b, the latch signal lat_res transitions to High in a pulsed way. Accordingly, the SR latch circuits 101k1a in all the rows are reset, and the output signals srq(k) of the SR latch circuits 101k1a transition to Low.

Next, at time T10c, the latch signal lat_s transitions to High in a pulsed way. At this time, only input signals tin(2j+1) (=the control signals ipsel(2j)) in the odd rows are High. Thus, only SR latch circuits 101(2j+1)1a in the odd rows are set, and the output signals srq(2j+1) of the SR latch circuits 101(2j+1)1a transition to High. Since SR latch circuits 101(2j)1a in the even rows are not set, the output signals srq(2j) are held Low in the even rows.

Next, at the time T11a, the latch signal lat_d transitions to High in a pulsed way. At this time, the D latch circuit 101k1b stores a level of the output signal srq(k). At this time, the output signals srq(2j+1) in the odd rows are High and the output signals srq(2j) in the even rows are Low. Thus, in the odd rows, the output signals dout(2j+1) transition to High and are held until the time T12a. On the other hand, since the output signals srq(2j) in the even rows are in the Low level, the output signals dout(2j) in the even rows transition to Low.

From the time T11a to the time T12a, the pixel drive pulse performs an operation similar to the operation during the time T10a to the time T11a except that the selected row is different. Thereafter, in a similar way, the control signal ipsel(k−1) in each row is input to the holding unit 101k1 in the next row.

Next, the waveform of the signal output to the output terminal test_out will be described. After the time T10, the waveforms according to information held in the SR latch circuit 101k1a are sequentially output to the output terminal test_out at the time T10 in each row. More specifically, during the period from the time T10a to the time T11a, the waveforms according to information held in an SR latch circuit 101n1a are output from the output terminal test_out at the time T10. Next, during the period from the time T11a to the time T12a, the waveforms according to information held in an SR latch circuit 101(n−1)1a are output from the output terminal test_out at the time T10. The same applies to subsequent periods. Here, in a case where the address decoder unit 1001 and the scanning signal selection unit 101k3 are not operating properly, the SR latch circuit 101k1a is incapable of holding the intended information. Accordingly, the waveforms output to the output terminal test_out do not match the expected waveform. In this manner, it is possible to determine whether any of the rows or the address decoder unit 1001 is operating normally.

As described above, in the present exemplary embodiment, the SR latch circuit 101k1a and the D latch circuit 101k1b of the holding unit 101k1 and the signal generation unit 101k2 can be inspected. In addition thereto, in the present exemplary embodiment, the address decoder unit 1001 and the scanning signal selection unit 101k3 can be inspected. As a result, the test coverage rate of the scan circuit can be improved.

In a case where a portion that outputs a scanning signal addr_bit(2j+1) of the address decoder unit 1001 is inspected, a set operation should at least be performed on the SR latch circuit in the (2j+1)th row. In addition, the control signal ipres_b(k) and the control signal iptx(k) can be inspected in a way similar to the ways in the first to third exemplary embodiments.

A fifth exemplary embodiment of the imaging apparatus according to the present invention will be described focusing on differences from the third exemplary embodiment. The imaging apparatus of the present exemplary embodiment is an imaging apparatus. In the third exemplary embodiment, an example has been described in which the vertical scan unit 103 includes only the holding unit of one system used for readout scan. In the present exemplary embodiment, the vertical scan unit 103 includes the holding units of two systems, i.e., the holding units for readout scan and for shutter scan. The overall block diagram, column configuration, and pixel circuit are similar to those in the third exemplary embodiment. In other words, disclosure in FIG. 1 and FIGS. 2A and 2B, and description thereof all apply to the fourth exemplary embodiment.

[Scan Circuit]

Figure 13:
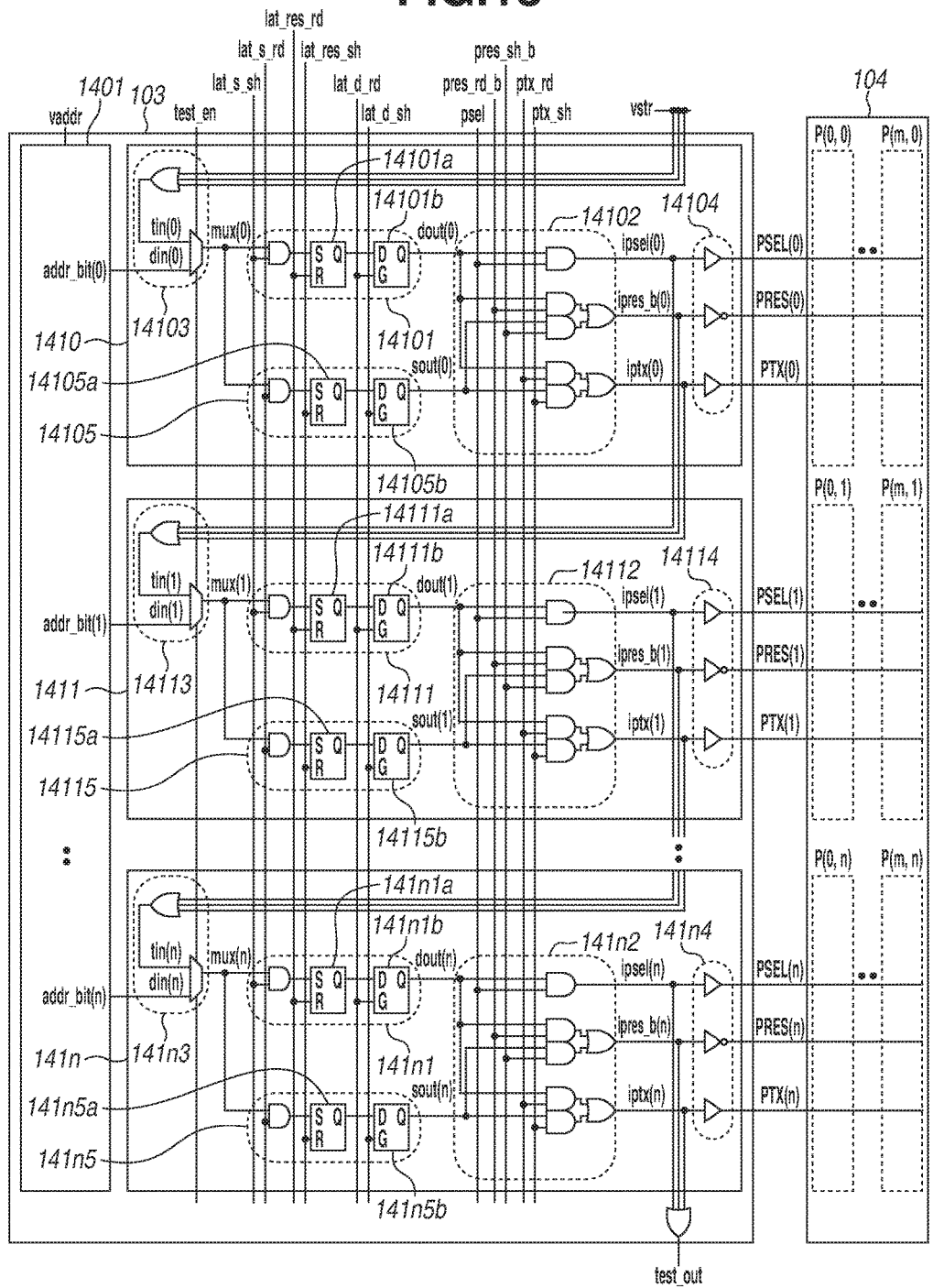
FIG. 13 is a block diagram schematically illustrating a configuration example of a vertical scan unit according to a fifth exemplary embodiment.

FIG. 13 is a block diagram illustrating a configuration example of the vertical scan unit 103 according to the present exemplary embodiment. The vertical scan unit 103 includes an address decoder unit 1401 and row drive units 1410 to 141n. The address decoder unit 1401 decodes an address signal vaddr generated by the control unit 102 into scanning signals addr_bit(0) to (n). The vertical scan unit 103 of the present exemplary embodiment drives a plurality of pixels in units of rows on the basis of the scanning signals addr_bit(0) to (n). In other words, the scan unit 103 is configured to drive the plurality of pixels based on a scanning signal in a row-by-row unit.

In the present exemplary embodiment, the holding unit for shutter scan is added to the vertical scan unit 103 of the third exemplary embodiment illustrated in FIG. 9. Along with that, various signal lines of the third exemplary embodiment are increased from one system to two systems.

A latch signal lat_s_rd and a latch signal lat_s_sh in the present exemplary embodiment bear the function of the latch signal lat_s of the third exemplary embodiment. A latch signal lat_res_rd and a latch signal lat_res_sh in the present exemplary embodiment bear the function of the latch signal lat_res of the third exemplary embodiment. A latch signal lat_d_rd and a latch signal lat_d_sh in the present exemplary embodiment bear the function of the latch signal lat_d of the third exemplary embodiment. A pulse pres_rd_b and a pulse pres_sh_b in the present exemplary embodiment bear the function of the pulse pres_b of the third exemplary embodiment.

A pulse ptx_rd and a pulse ptx_sh in the present exemplary embodiment bear the function of the pulse ptx of the third exemplary embodiment. The signals with "rd" appended at the end of the sign is used at the time of the readout scan. The signals with "sh" appended at the end of the sign is used at the time of the shutter scan.

A configuration of the row drive unit 1411 in the first row will be described as an example. The same applies to the row drive units in other rows. The row drive unit 1411 includes a holding unit 14111 for readout scan, a signal generation unit 14112, a scanning signal selection unit 14113, and a level shift unit 14114. These configurations are the same as those in the third exemplary embodiment. The row drive unit 1411 further includes a holding unit 14115 for shutter scan. The row drive unit 1411 supplies control signals to a plurality of control lines connected to pixels in corresponding one row.

The holding unit 14111 for readout scan includes an AND gate that calculates the logical product (AND) of an output signal mux(1) and the latch signal lat_s_rd, an SR latch circuit 14111a as a first holding unit, and a D latch circuit 14111b as a second holding unit.

The holding unit 14115 for shutter scan includes an AND gate that calculates the logical product (AND) of the output signal mux(1) and the latch signal lat_s_sh, an SR latch circuit 14115*a* as a first holding unit, and a D latch circuit 14115*b* as a second holding unit.

The signal generation unit 14112 performs a logical operation between an output signal dout(1) of the holding unit 14111 and a pulse psel generated by the control unit 102 to generate a control signal ipsel(1). Further, in the shutter scan, it is sufficient to reset the photoelectric conversion element 301, so it is not necessary to connect the pixel to the vertical output line 202. Accordingly, an output signal sout(1) of the holding unit 14115 for shutter scan is not involved in control of the control signal ipsel(1).

The signal generation unit 14112 performs a logical operation on the output signal dout(1) of the holding unit 14111, the output signal sout(1) of the holding unit 14115, the pulse pres_rd_b, and the pulse pres_sh_b to generate a control signal ipres_b(1).

The signal generation unit 14112 performs a logical operation on the output signal dout(1) of the holding unit 14111, the output signal sout(1) of the holding unit 14115, and the pulse ptx_rd and the pulse ptx_sh generated by the control unit 102 to generate a control signal iptx(1).

A configuration of the level shift unit 14114 is similar to those in the first to fourth exemplary embodiments. For that reason, the detailed description will be omitted.

A configuration of the scanning signal selection unit 14113 is similar to those in the second to fourth exemplary embodiments. However, the output signal mux(1) of the scanning signal selection unit 14113 is input to the holding unit 14111 for reading out a signal and the holding unit 14115 for shutter scan. Since an input signal din(1) and an input signal tin(1) and selection of these signals are the same as those in the second to fourth exemplary embodiments, the description thereof will be omitted.

The scanning signal selection unit 14113 illustrated in FIG. 13 is an example, and a circuit configuration of the scanning signal selection unit 14113 can be changed. For example, instead of calculating the logical sum (OR) of O control signals, the logical operation such as the exclusive logical sum (EXOR) may be used. Alternatively, instead of performing the logical operation, a multiplexer may be used. Further, a combination of the SR latch circuit and the D latch circuit is illustrated as an example of the holding unit 14111. However, a configuration of the holding unit 14111 can be changed. For example, one or both of the SR latch circuit and the D latch circuit may be replaced by a flip-flop circuit. The same applies to the holding unit 14115.

[Drive Method 5-1: Readout Operation of Photoelectric Conversion Element]

Next, a method of driving the imaging apparatus according to the present exemplary embodiment will be described. In the present exemplary embodiment, the photoelectric conversion element 301 is first reset by the shutter scan. Next, signals based on electric charges accumulated in the photoelectric conversion element 301 are read out by the readout scan. An accumulation time is a period from time when the photoelectric conversion element 301 is reset to time when the electric charges of the photoelectric conversion element 301 are transferred.

First, the shutter scan will be described. In an operation of the shutter scan, scanning is performed similarly to the readout operation of the signals based on the electric charges generated in the photoelectric conversion element 301 of the third exemplary embodiment. The photoelectric conversion elements 301 of pixels P(0, n) to (m, n) are sequentially reset while changing the selected row.

The timing chart of each signal is illustrated in FIG. 10. However, in the shutter scan of the present exemplary embodiment, assignment of the control signals is as follows. The latch signal lat_s in FIG. 10 is used for the latch signal lat_s_sh of the present exemplary embodiment. The latch signal lat_res in FIG. 10 is used for the latch signal lat_res_sh of the present exemplary embodiment. The latch signal lat_d in FIG. 10 is used for the latch signal lat_d_sh of the present exemplary embodiment. The pulse pres_b in FIG. 10 is used for the pulse pres_sh_b of the present exemplary embodiment. The pulse ptx in FIG. 10 is used for the pulse ptx_sh of the present exemplary embodiment. The entire description of FIG. 10 applies to the present exemplary embodiment by replacing corresponding signs. The detailed description is omitted here.

Next, the readout scan will be described. In an operation of the readout scan, scanning is performed similarly to the readout operation of the signals based on the electric charges generated in the photoelectric conversion element 301 of the third exemplary embodiment. The signals from the photoelectric conversion elements 301 of the pixels P(0, n) to (m, n) are sequentially read out while changing the selected row.

The timing chart of each signal is illustrated in FIG. 10. However, in the readout scan of the present exemplary embodiment, assignment of the control signals is as follows. The latch signal lat_s in FIG. 10 is used for the latch signal lat_s_rd of the present exemplary embodiment. The latch signal lat_res in FIG. 10 is used for the latch signal lat_res_rd of the present exemplary embodiment. The latch signal lat_d in FIG. 10 is used for the latch signal lat_d_rd of the present exemplary embodiment. The pulse pres_b in FIG. 10 is used for the pulse pres_rd_b of the present exemplary embodiment. The pulse ptx in FIG. 10 is used for the pulse ptx_rd of the present exemplary embodiment. The entire description of FIG. 10 applies to the present exemplary embodiment by replacing corresponding signs. The detailed description is omitted here.

[Drive Method 5-2: Test Operation of Vertical Scan Unit]

Next, a test operation for inspecting the vertical scan unit 103 will be described. In the present exemplary embodiment, a holding unit 141*k*5 for shutter scan and a logic circuit that receives an output signal sout(k) of a signal generation unit 141*k*2 are inspected. Next, a holding unit 141*k*1 for readout scan and a logic circuit that receives an output signal dout(k) of the signal generation unit 141*k*2 are inspected.

First, a test operation of a circuit related to the shutter scan will be described. The test operation of the circuit related to the shutter scan is similar to the test operation of the vertical scan unit 103 of the third exemplary embodiment. More specifically, the timing chart of each control signal is illustrated in FIG. 11. However, assignment of the control signals is as follows.

The latch signal lat_s in FIG. 11 is used for the latch signal lat_s_sh of the present exemplary embodiment. The latch signal lat_res in FIG. 11 is used for the latch signal lat_res_sh of the present exemplary embodiment. The function of the latch signal lat_d in FIG. 11 is used for the latch signal lat_d_sh of the present exemplary embodiment. The function of the pulse pres_b in FIG. 11 is used for the pulse pres_sh_b of the present exemplary embodiment. The function of the pulse ptx in FIG. 11 is used for the pulse ptx_sh of the present exemplary embodiment. The entire description of FIG. 11 applies to the present exemplary embodiment by replacing corresponding signs. The detailed description is omitted here.

As described above, the holding unit 141k5 for shutter scan and the logic circuit that receives the output signal sout(k) of the signal generation unit 141k2 can be inspected.

Next, a test operation of a circuit related to the readout scan will be described. The test operation of the circuit related to the readout scan is similar to the test operation of the vertical scan unit 103 of the third exemplary embodiment. More specifically, the timing chart of each control signal is illustrated in FIG. 11. However, assignment of the control signals is as follows.

The latch signal lat_s in FIG. 11 is used for the latch signal lat_s_rd of the present exemplary embodiment. The latch signal lat_res in FIG. 11 is used for the latch signal lat_res_rd of the present exemplary embodiment. The latch signal lat_d in FIG. 11 is used for the latch signal lat_d_rd of the present exemplary embodiment. The pulse pres_b in FIG. 11 is used for the pulse pres_rd_b of the present exemplary embodiment. The pulse ptx in FIG. 11 is used for the pulse ptx_rd of the present exemplary embodiment. The entire description of FIG. 11 applies to the present exemplary embodiment by replacing corresponding signs. The detailed description is omitted here.

As described above, the holding unit 141k1 for readout scan and the logic circuit that receives the output signal dout(k) of the signal generation unit 141k2 can be inspected.

According to the present exemplary embodiment, the test coverage rate of the scan circuit can be improved.

A sixth exemplary embodiment of the imaging apparatus according to the present invention will be described focusing on differences from the fifth exemplary embodiment. The imaging apparatus of the present exemplary embodiment is an imaging apparatus. In the fifth exemplary embodiment, a method of inspecting the holding unit 141k1 for readout scan, the holding unit 141k5 for shutter scan, and the signal generation unit 141k2 has been described. In addition thereto, in the present exemplary embodiment, the address decoder unit 1401 and the scanning signal selection unit 141k3 can also be inspected.

The overall block diagram, column configuration, pixel circuit, and vertical scan unit 103 in the present exemplary embodiment are similar to those in the fifth exemplary embodiment. In other words, disclosure in FIG. 1 and FIGS. 2A and 2B, and description thereof all apply to the sixth exemplary embodiment. Further, the vertical scan unit 103 of the present exemplary embodiment is illustrated in FIG. 13. The entire description of FIG. 13 applies to the sixth exemplary embodiment.

Next, a method of driving the imaging apparatus according to the present exemplary embodiment will be described. In the present exemplary embodiment, the address decoder unit 1401 and the scanning signal selection unit 141k3 are inspected with the same method as described in the fourth exemplary embodiment. More specifically, the timing chart of each signal used for the present exemplary embodiment is illustrated in FIG. 12. However, as described in the fifth exemplary embodiment, "sh" or "rd" is appended at the end of the sign of each signal. In a case where a portion related to the shutter scan is inspected, the "sh" is appended. In a case where a portion related to the readout scan is inspected, the "rd" is appended. Since other operations are the same as those in the fifth exemplary embodiment, the description thereof will be omitted.

As described above, according to the present exemplary embodiment, the test coverage rate of the scan circuit can be improved.

In the first to sixth exemplary embodiments, the imaging apparatus including the pixels including the photoelectric conversion element 301 has been described. The imaging apparatus according to the present invention is not limited to the imaging apparatus. The imaging apparatus according to a seventh exemplary embodiment is a display apparatus including pixels including a light emitting element.

Figure 14:
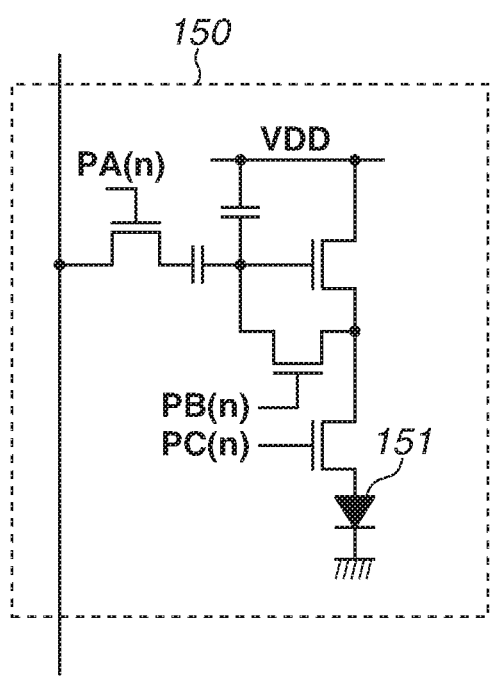
FIG. 14 is an equivalent circuit diagram of a pixel of a display apparatus according to a seventh exemplary embodiment.

FIG. 14 illustrates an example of a pixel 150 including a light emitting element. The pixel 150 includes an organic electroluminescence (EL) element 151 as the light emitting element. Further, the pixel 150 includes signal lines PA(n), PB(n), and PC(n). Here, the signal lines PA(n), PB(n) and PC(n) correspond to control lines that supply the row selection signal PSEL(n), the pixel unit reset signal PRES_B (n), and the pixel transfer signal PTX(n) of the first to sixth exemplary embodiments, respectively. Thus, the vertical scan unit 103 described in the first to sixth exemplary embodiments is used for the display apparatus of the present exemplary embodiment. Further, the operation of the pixel and the test operation of the vertical scan unit can be similarly applied.

Accordingly, according to the present exemplary embodiment, the test coverage rate of the scan circuit of the display apparatus can be improved.

Figure 15:
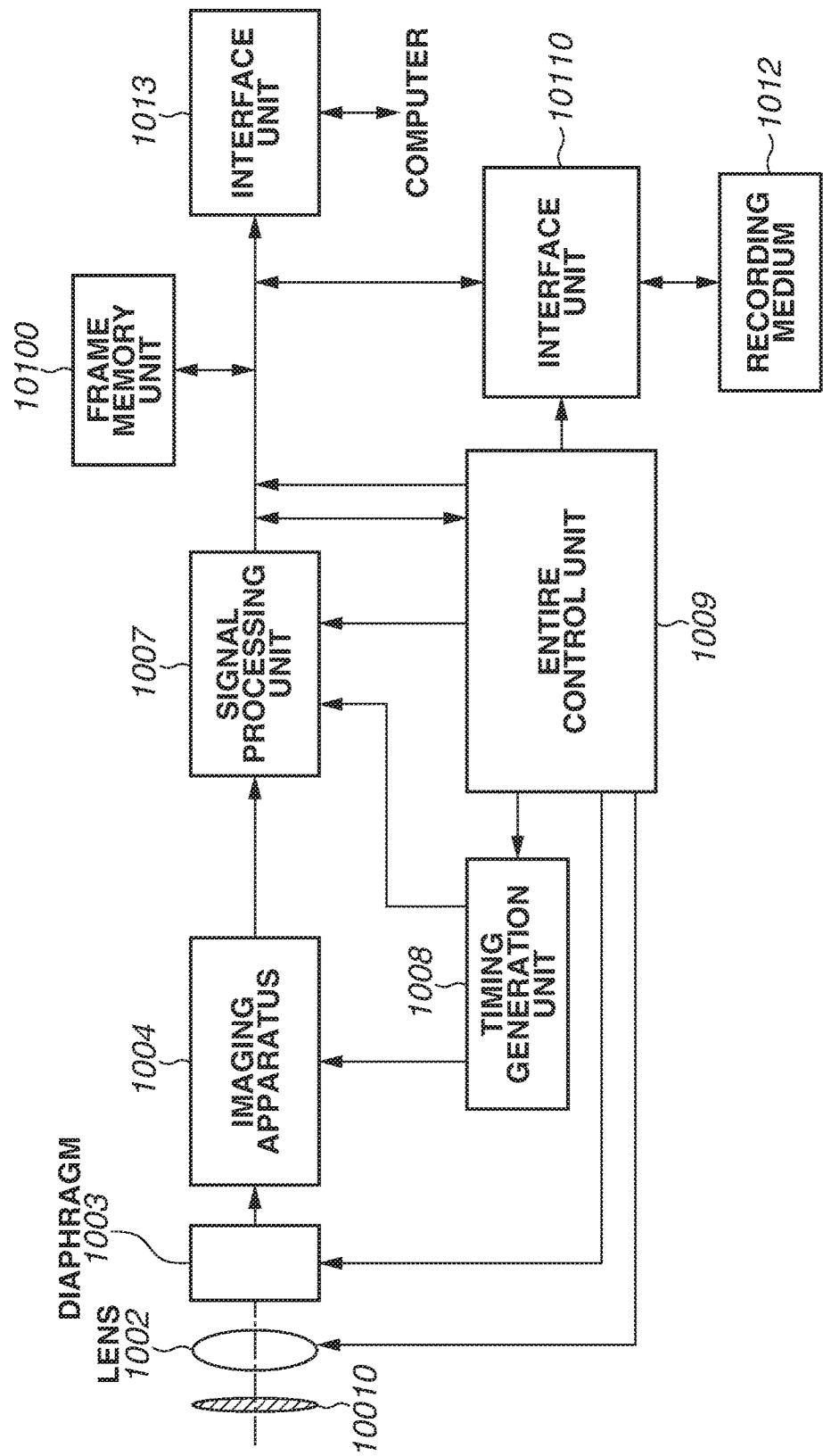
FIG. 15 is a block diagram of an exemplary embodiment of an imaging system.

An exemplary embodiment of an imaging system as an eighth exemplary embodiment will be described. Examples of the imaging system include a digital still camera, a digital camcorder, a camera head, a copying machine, a facsimile, a cellular phone, an in-vehicle camera, and an observation satellite. FIG. 15 is a block diagram of the digital still camera as an example of the imaging system.

In FIG. 15, a barrier 10010 protects a lens. A lens 1002 forms an optical image of an object on an imaging apparatus 1004. A diaphragm 1003 varies an amount of light that has passed through the lens 1002. For the imaging apparatus 1004, the imaging apparatus described in one of the above first to sixth exemplary embodiments is used.

A signal processing unit 1007 performs processing such as correction and data compression on a pixel signal output from the imaging apparatus 1004 to obtain an image signal. Further, in FIG. 15, a timing generation unit 1008 outputs various timing signals to the imaging apparatus 1004 and the signal processing unit 1007, and an entire control unit 1009 controls the entire digital still camera. A frame memory unit 10100 temporarily stores image data. An interface unit 10110 performs recording on or reading out from a recording medium. A removable recording medium 1012 such as a semiconductor memory performs recording or reading out of image data. An interface unit 1013 communicates with an external computer or the like.

The imaging system should at least include the imaging apparatus 1004 and the signal processing unit 1007 that processes the pixel signal output from the imaging apparatus 1004. In that case, other configurations are arranged outside the system.

As described above, in the exemplary embodiment of the imaging system, one of the imaging apparatuses of the first to sixth exemplary embodiments is used for the imaging apparatus 1004. With such a configuration, the test coverage rate of the imaging system can be improved.

Figure 16A:
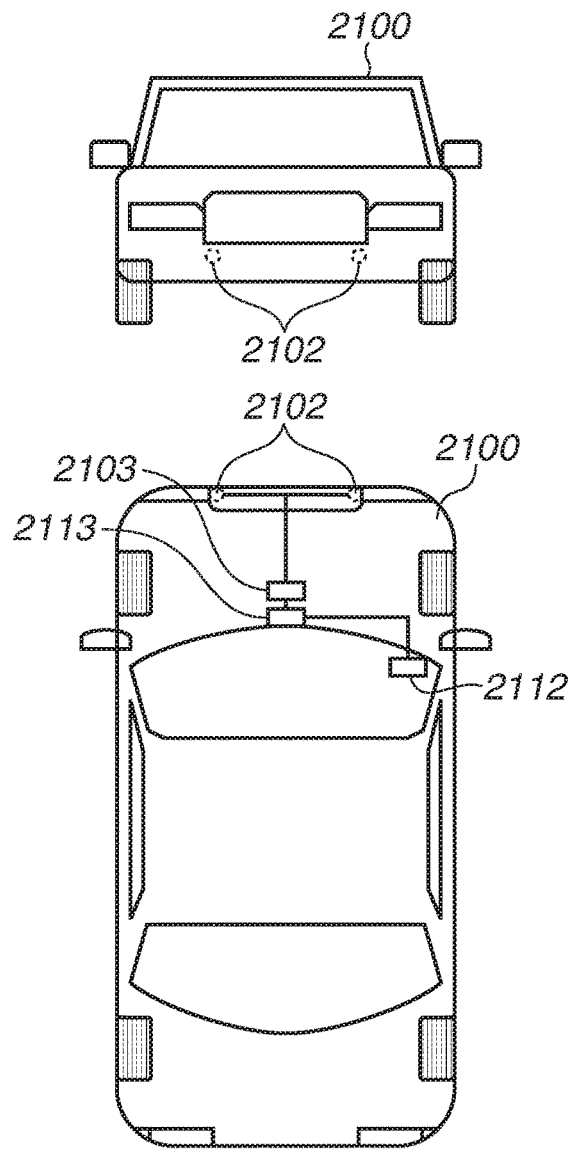
FIGS. 16A and 16B are block diagrams of an exemplary embodiment of a moving object.

An exemplary embodiment of a moving object will be described. The moving object of a ninth exemplary embodiment is an automobile equipped with an in-vehicle camera. FIG. 16A schematically illustrates an appearance and a main internal structure of an automobile 2100. The automobile 2100 includes imaging apparatuses 2102, an application specific integrated circuit (ASIC) 2103 for an imaging system, an alarm device 2112, and a main control unit 2113.

For the imaging apparatuses 2102, the imaging apparatus described in each exemplary embodiment described above is used. The alarm device 2112 gives warning to a driver when receiving a signal indicating an abnormality from the imaging system, a vehicle sensor, a control unit, and the like. The main control unit 2113 integrally controls operations of the imaging system, the vehicle sensor, the control unit, and the like. The automobile 2100 may not include the main control unit 2113. In this case, the imaging system, the vehicle sensor, and the control unit individually have a communication interface, and each transmit and receive a control signal via a communication network (for example, the controller area network (CAN) standard).

Figure 16B:
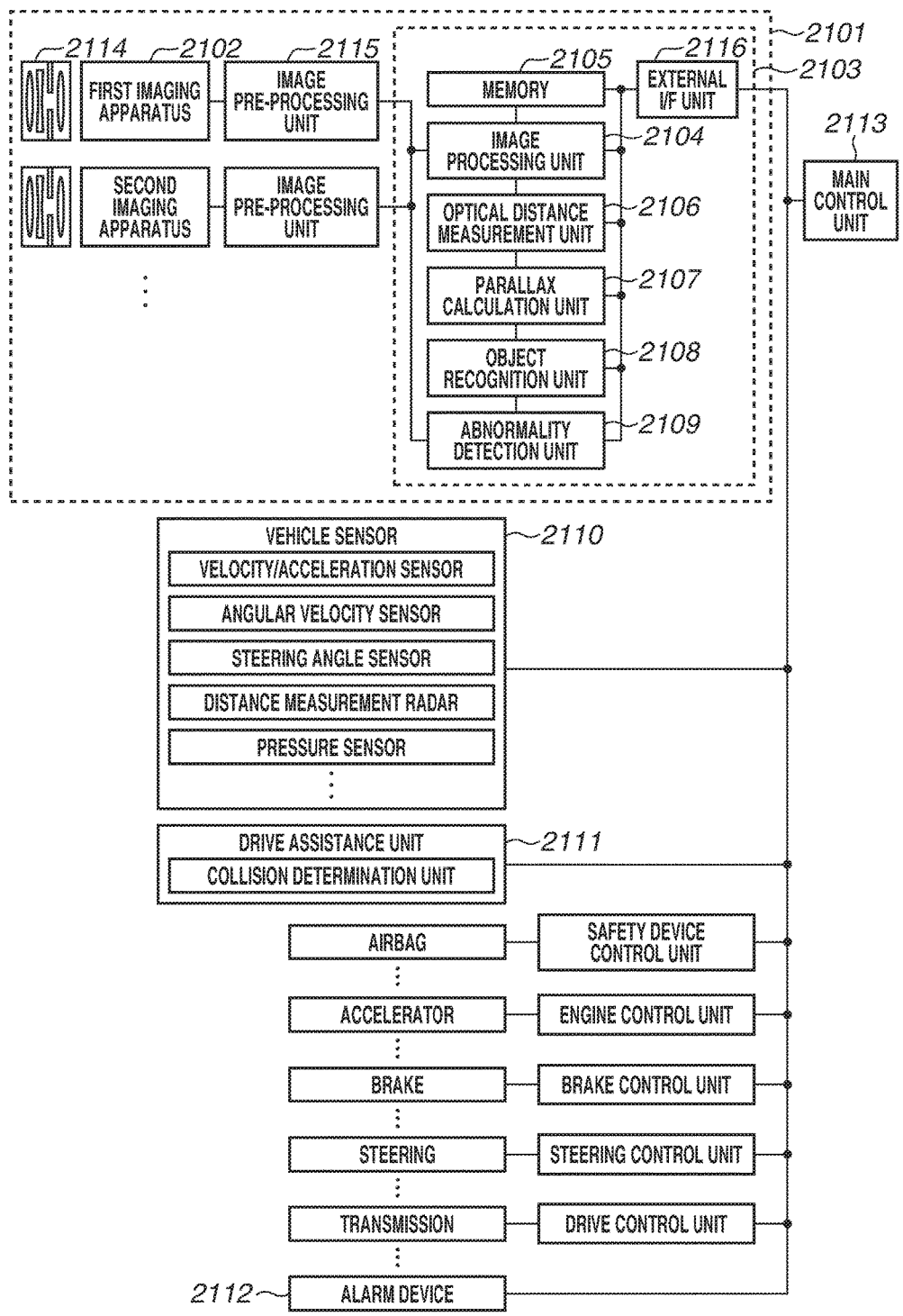

FIG. 16B is a block diagram illustrating a system configuration of the automobile 2100. The automobile 2100 includes a first imaging apparatus 2102 and a second imaging apparatus 2102. More specifically, the in-vehicle camera of the present exemplary embodiment is a stereo camera. An object image is formed on the imaging apparatuses 2102 by an optical unit 2114. A pixel signal output from the imaging apparatuses 2102 is processed by an image pre-processing unit 2115, and is transmitted to the ASIC 2103 for an imaging system. The image pre-processing unit 2115 performs processing such as SN calculation and addition of a synchronization signal.

The ASIC 2103 for an imaging system includes an image processing unit 2104, a memory 2105, an optical distance measurement unit 2106, a parallax calculation unit 2107, an object recognition unit 2108, an abnormality detection unit 2109, and an external interface (I/F) unit 2116. The image processing unit 2104 processes the pixel signal to generate an image signal. Further, the image processing unit 2104 corrects the image signal and complements an abnormal pixel. The memory 2105 temporarily holds the image signal. Further, the memory 2105 may store a position of the abnormal pixel of the known imaging apparatuses 2102. The optical distance measurement unit 2106 performs focusing or distance measurement on an object using the image signal. The parallax calculation unit 2107 performs object collation (stereo matching) on a parallax image. The object recognition unit 2108 analyzes the image signal and recognizes the object such as an automobile, a person, a sign, and a road. The abnormality detection unit 2109 detects failure or malfunction of the imaging apparatuses 2102. In a case where the failure or the malfunction is detected, the abnormality detection unit 2109 sends, to the main control unit 2113, a signal indicating that the abnormality has been detected. The external I/F unit 2116 mediates exchange of information between each unit of the ASIC 2103 for an imaging system and the main control unit 2113 or various control units, and the like.

The automobile 2100 includes a vehicle information obtaining unit 2110 and a drive assistance unit 2111. The vehicle information obtaining unit 2110 includes vehicle sensors such as a velocity/acceleration sensor, an angular velocity sensor, a steering angle sensor, a distance measurement radar, and a pressure sensor.

The drive assistance unit 2111 includes a collision determination unit. The collision determination unit determines a possibility of collision with an object on the basis of information from the optical distance measurement unit 2106, the parallax calculation unit 2107, and the object recognition unit 2108. The optical distance measurement unit 2106 and the parallax calculation unit 2107 are examples of a distance information obtaining unit that obtains distance information to a target object. More specifically, the distance information means information regarding parallax, a defocus amount, distance to the target object, and the like. The collision determination unit may determine the possibility of collision by using any one of these pieces of the distance information. The distance information obtaining unit may be implemented by exclusively designed hardware or by a software module.

Although an example in which the drive assistance unit 2111 controls the automobile 2100 so as not to collide with another object has been described, the drive assistance unit 2111 is also applicable to control to automatically operate the automobile 2100 to follow another vehicle, control to automatically operate the automobile 2100 not to deviate from a lane, and the like.

The automobile 2100 further includes drive units used for traveling such as an airbag, an accelerator, a brake, a steering, and a transmission. The automobile 2100 also includes control units of these drive units. The control unit controls the corresponding drive unit on the basis of the control signal of the main control unit 2113.

The imaging system used in the present exemplary embodiment can be applied not only to the automobiles but also to moving objects (moving apparatuses) such as ships, aircrafts, and industrial robots. In addition, the imaging system can be applied not only to the moving objects but also to devices that utilize object recognition widely, such as intelligent transport systems (ITS).

As described above, in the exemplary embodiment of the automobile, one of the imaging apparatuses of the first to sixth exemplary embodiments is used for the imaging apparatuses 2102. With such a configuration, the test coverage rate can be improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-014846, filed Jan. 30, 2017, which is hereby incorporated by reference herein in its entirety.

What is claimed is:

1. An imaging apparatus comprising:
  a plurality of pixels arranged to form a plurality of rows including a first row and a second row;
  a plurality of first control lines connected to the pixels of the first row;
  a plurality of second control lines connected to the pixels of the second row; and
  a scan unit including at least a first row drive unit configured to generate a plurality of first control signals supplied to the plurality of first control lines and a second row drive unit configured to generate a plurality of second control signals supplied to the plurality of second control lines, the scan unit being configured to drive the plurality of pixels based on a scanning signal in a row-by-row unit,
  wherein the plurality of first control signals generated by the first row drive unit is input to the second row drive unit, and
  wherein the second row drive unit selects one from the plurality of first control signals and the scanning signal and generates the plurality of second control signals based on a selected signal.

2. The imaging apparatus according to claim 1,
wherein each of the plurality of pixels includes a photoelectric conversion element, a transfer transistor, and a reset transistor, and
wherein the plurality of first control lines includes a control line connected to the transfer transistor and a control line connected to the reset transistor.

3. The imaging apparatus according to claim 1,
wherein the first row drive unit includes a plurality of buffer circuits,
wherein an output node of each of the plurality of buffer circuits is connected to corresponding one of the plurality of first control lines, and
wherein an input node of each of the plurality of buffer circuits is connected to the second row drive unit.

4. The imaging apparatus according to claim 1,
wherein each of the first row drive unit and the second row drive unit includes a first holding unit and a second holding unit connected to an output node of the first holding unit, and
wherein the plurality of first control signals generated by the first row drive unit is input to the first holding unit of the second row drive unit.

5. The imaging apparatus according to claim 4, wherein the first holding unit includes an SR latch circuit, and the second holding unit includes a D latch circuit.

6. The imaging apparatus according to claim 1, further comprising a logic circuit configured to perform a logical operation on the plurality of first control signals and output a result of the logical operation to the second row drive unit.

7. An imaging apparatus comprising:
a plurality of pixels arranged to form a plurality of rows including a first row and a second row;
a first control line connected to the pixels of the first row;
a second control line connected to the pixels of the second row; and
a scan unit including at least a first row drive unit configured to generate a first control signal supplied to the first control line and a second row drive unit configured to generate a second control signal supplied to the second control line, the scan unit being configured to drive the plurality of pixels based on a scanning signal in a row-by-row unit,
wherein each of the first row drive unit and the second row drive unit includes a first holding unit and a second holding unit connected to an output node of the first holding unit,
wherein the first control signal generated by the first row drive unit and output from the second holding unit of the first row drive unit is input to the first holding unit of the second row drive unit, and
wherein the second row drive unit selects one from the first control signal and the scanning signal and outputs the second control signal based on a selected signal.

8. The imaging apparatus according to claim 7, wherein the first holding unit includes an SR latch circuit, and the second holding unit includes a D latch circuit.

9. The imaging apparatus according to claim 7,
wherein the first row drive unit includes a plurality of buffer circuits,
wherein an output node of the plurality of buffer circuits is connected to the first control line, and
wherein an input node of the plurality of buffer circuits is connected to the second row drive unit.

10. The imaging apparatus according to claim 7,
wherein each of the plurality of pixels includes a photoelectric conversion element, a transfer transistor, and a reset transistor, and
wherein the first control line is connected to the transfer transistor or the reset transistor.

11. The imaging apparatus according to claim 1, further comprising an address decoder configured to supply the scanning signal to the scan unit.

12. The imaging apparatus according to claim 1, wherein each of the first row drive unit and the second row drive unit includes a flip-flop circuit configured to hold and output the scanning signal.

13. The imaging apparatus according to claim 1, wherein each of the plurality of pixels includes a light emitting element.

14. An imaging system comprising:
the imaging apparatus according to claim 1; and
a processing apparatus configured to process a signal output from the imaging apparatus to obtain an image signal.

15. A moving object comprising:
the imaging apparatus according to claim 1;
a processing apparatus configured to perform processing on a signal output from the imaging apparatus; and
a control unit configured to control the moving object based on a result of the processing.

16. The imaging apparatus according to claim 7, further comprising an address decoder configured to supply the scanning signal to the scan unit.

17. The imaging apparatus according to claim 7, wherein each of the first row drive unit and the second row drive unit includes a flip-flop circuit configured to hold and output the scanning signal.

18. The imaging apparatus according to claim 7, wherein each of the plurality of pixels includes a light emitting element.

19. A moving object comprising:
the imaging apparatus according to claim 7;
a processing apparatus configured to perform processing on a signal output from the imaging apparatus; and
a control unit configured to control the moving object based on a result of the processing.

20. A scan circuit comprising:
a plurality of first control lines;
a plurality of second control lines; and
a scan unit including at least a first row drive unit configured to generate a plurality of first control signals supplied to the plurality of first control lines and a second row drive unit configured to generate a plurality of second control signals supplied to the plurality of second control lines, the scan unit being configured to generate a scanning signal,
wherein the plurality of first control signals generated by the first row drive unit is input to the second row drive unit, and
wherein the second row drive unit selects the plurality of first control signals and the scanning signal and generates the plurality of second control signals based on the selected signals.

* * * * *